(12) United States Patent
Woody, V et al.

(10) Patent No.: US 10,882,283 B2
(45) Date of Patent: Jan. 5, 2021

(54) SEGMENTED PROTECTIVE DISPLAY FILM

(71) Applicant: 3M INNOVATIVE PROPERTIES COMPANY, St. Paul, MN (US)

(72) Inventors: Joseph W. Woody, V, Woodbury, MN (US); David S. Thompson, Bayport, MN (US); Steven D. Solomonson, Shoreview, MN (US); John J. Stradinger, Roseville, MN (US); Ryan M. Braun, St. Paul, MN (US); Joseph D. Rule, Woodbury, MN (US); Peter D. Condo, Lake Elmo, MN (US); Catherine A. Leatherdale, Woodbury, MN (US); Michael A. Johnson, Stillwater, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 27 days.

(21) Appl. No.: 16/469,726

(22) PCT Filed: Dec. 14, 2017

(86) PCT No.: PCT/US2017/066379
§ 371 (c)(1),
(2) Date: Jun. 14, 2019

(87) PCT Pub. No.: WO2018/112181
PCT Pub. Date: Jun. 21, 2018

(65) Prior Publication Data
US 2020/0001577 A1    Jan. 2, 2020

Related U.S. Application Data

(60) Provisional application No. 62/434,027, filed on Dec. 14, 2016.

(51) Int. Cl.
B32B 17/10 (2006.01)
H01L 51/00 (2006.01)
(Continued)

(52) U.S. Cl.
CPC ............ B32B 17/1077 (2013.01); B32B 7/12 (2013.01); B32B 17/10036 (2013.01);
(Continued)

(58) Field of Classification Search
CPC . B32B 17/1077; B32B 7/12; B32B 17/10036; B32B 2457/206; B32B 3/14;
(Continued)

(56) References Cited

U.S. PATENT DOCUMENTS 3,391,053 A    7/1968   Kolb
3,574,030 A    4/1971   Callander
(Continued)

FOREIGN PATENT DOCUMENTS

KR    1020100023355    3/2010
WO    WO 2003-094256    11/2003
(Continued)

OTHER PUBLICATIONS

Miller, "A new derivation of post gel properties of network polymers", Macromolecules, 1976, vol. 9, No. 2, pp. 206-211.
(Continued)

Primary Examiner — Kyoung Lee
(74) Attorney, Agent, or Firm — Lisa P. Fulton

(57) ABSTRACT

A display film comprises a transparent glass layer including two or more co-planar glass layer segments and a thickness defined by a first major surface and a second major surface opposing the first major surface being less than 500 micrometers; interstitial polymer material separating adjacent segments; and transparent energy dissipation layer having a
(Continued)

glass transition temperature of 27 degrees Celsius or less and a Tan Delta peak value of 0.5 or greater and being disposed on the first major surface.

36 Claims, 6 Drawing Sheets

(51) Int. Cl.
    *B32B 7/12*      (2006.01)
    *H01L 27/32*      (2006.01)

(52) U.S. Cl.
    CPC ...... *H01L 27/3244* (2013.01); *H01L 51/0097* (2013.01); *B32B 2457/206* (2013.01); *H01L 2251/5338* (2013.01)

(58) Field of Classification Search
    CPC ....... B32B 3/18; B32B 17/064; B32B 27/281; B32B 27/325; B32B 3/08; B32B 7/06; B32B 27/16; B32B 2307/7244; B32B 27/08; B32B 27/06; B32B 27/34; B32B 27/36; B32B 27/365; B32B 2307/748; B32B 2250/03; B32B 2250/02; B32B 2307/584; B32B 2255/10; B32B 2307/51; B32B 2255/26; H01L 27/3244; H01L 51/0097; H01L 2251/5338; Y02E 10/549
    See application file for complete search history.

(56) References Cited

U.S. PATENT DOCUMENTS

| | | | |
|---|---|---|---|
| 4,745,152 A | 5/1988 | Fock | |
| 4,921,759 A | 5/1990 | Orain | |
| 5,277,944 A | 1/1994 | Holzer | |
| 5,798,409 A | 8/1998 | Ho | |
| 6,376,082 B1 | 4/2002 | Edmond | |
| 6,376,590 B2 | 4/2002 | Kolb | |
| 6,815,070 B1 | 11/2004 | Burkle | |
| 7,241,437 B2 | 7/2007 | Davidson | |
| 7,980,910 B2 | 7/2011 | Padiyath | |
| 8,263,731 B2 | 9/2012 | Liu | |
| 8,507,632 B2 | 8/2013 | Hara | |
| 2006/0148950 A1 | 7/2006 | Davidson | |
| 2007/0092733 A1 | 4/2007 | Yang | |
| 2008/0020170 A1* | 1/2008 | Haubrich | C09D 133/14 428/65.1 |
| 2009/0280329 A1 | 11/2009 | Rukavina | |
| 2011/0045306 A1 | 2/2011 | Johnson | |
| 2012/0204566 A1 | 8/2012 | Hartzell | |
| 2012/0229893 A1 | 9/2012 | Hebrink | |
| 2013/0251961 A1 | 9/2013 | Johnson | |
| 2013/0261209 A1 | 10/2013 | Kim | |
| 2014/0092360 A1 | 4/2014 | Zheng | |
| 2015/0207102 A1 | 7/2015 | Jeong | |
| 2015/0330597 A2 | 11/2015 | Schaffer | |
| 2016/0002103 A1 | 1/2016 | Wang | |
| 2016/0016338 A1 | 1/2016 | Radcliffe | |

FOREIGN PATENT DOCUMENTS

| | | |
|---|---|---|
| WO | WO 2006-102383 | 9/2006 |
| WO | WO 2009-029438 | 3/2009 |
| WO | WO 2009-120548 | 10/2009 |
| WO | WO 2011-056396 | 5/2011 |
| WO | WO 2014-035942 | 3/2014 |
| WO | WO 2014-092422 | 6/2014 |
| WO | WO 2014-197194 | 12/2014 |
| WO | WO 2014-197368 | 12/2014 |
| WO | WO 2015-191949 | 12/2015 |
| WO | WO 2014-011731 | 1/2016 |
| WO | WO 2016-028542 | 2/2016 |
| WO | WO 2016-196460 | 12/2016 |
| WO | WO 2017-105850 | 6/2017 |
| WO | WO 2017-214105 | 12/2017 |
| WO | WO 2018-057774 | 3/2018 |
| WO | WO 2018-102607 | 6/2018 |

OTHER PUBLICATIONS

Ni, "A review on colorless and optically transparent polyimide films: Chemistry, process and engineering applications", Aug. 2015, Journal of Industrial and Engineering Chemistry, vol. 28, vol. 16-27.
International Search report for PCT International Application No. PCT/US2016/050395 dated Nov. 23, 2016, 5 pages.

* cited by examiner

SEGMENTED PROTECTIVE DISPLAY FILM

BACKGROUND

Displays and electronic devices have evolved to be curved, bent, or folded and provide new user experiences. These device architectures may include flexible organic light emitting diodes (OLEDs), plastic liquid crystal displays (LCDs) and the like, for example.

In order to realize such flexible displays and protect elements in the displays, a flexible cover sheet or flexible window film replaces a conventional glass cover sheet. This flexible cover sheet has several design parameters such as; high visible light transmission, low haze, excellent scratch resistance and impact resistance, in order to protect the elements included in the display devices. In some cases the flexible cover sheet may also need to withstand thousands of folding events around a tight bend radius (about 5 mm or less) without showing visible damage. In other cases, the flexible cover sheet must be able to unfold without leaving a visible crease after being bent at elevated temperature and humidity.

A variety of hard coated plastic substrates have been explored. More exotic materials like hard coated colorless transparent polyimide films have also been shown to have high hardness and good scratch resistance. However, many hard-coated films fail to withstand folding events around a tight bend radius without showing visible damage and fail to provide adequate impact resistance.

SUMMARY

The present disclosure relates to display films including a segmented glass layer that can protect a display window and survive folding tests intact. The segmented protective display film maintains optical properties of a display film while providing scratch resistance and impact resistance to the display.

In one aspect, a display film includes a transparent glass layer comprising two or more co-planar glass layer segments and having a thickness defined by a first major surface and a second major surface opposing the first major surface. The thickness may be less than 500 micrometers. Interstitial polymer material separates adjacent segments. A polymer layer or transparent energy dissipation layer is disposed on the first major surface.

In another aspect, a display film includes a transparent glass layer formed of two or more co-planar glass layer segments and having a thickness defined by a first major surface and a second major surface opposing the first major surface. The thickness may be less than 500 micrometers, or in a range from 25 micrometers to 250 micrometers, or in a range from 25 micrometers to 150 micrometers. Interstitial polymer material separates adjacent segments. A transparent energy dissipation layer is disposed on the first major surface. The transparent energy dissipation layer has a glass transition temperature of 27 degrees Celsius or less and a Tan Delta peak value of 0.5 or greater.

In another aspect, a display film includes a transparent glass layer formed of two or more co-planar glass layer segments and having a thickness defined by a first major surface and a second major surface opposing the first major surface. The thickness may be less than 500 micrometers, or in a range from 25 micrometers to 250 micrometers, or in a range from 25 micrometers to 150 micrometers. A polymer layer is disposed on the first major surface. The polymer layer is formed of a polymer material and the polymer material also forms interstitial polymer material separating adjacent segments. A transparent energy dissipation layer is disposed on the polymer layer. The polymer layer separates the transparent energy dissipation layer from the transparent glass layer. The transparent energy dissipation layer has a glass transition temperature of 27 degrees Celsius or less and a Tan Delta peak value of 0.5 or greater.

In another aspect, an article includes an optical display and a display film described herein. An optical adhesive layer fixes the display film to the optical display.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
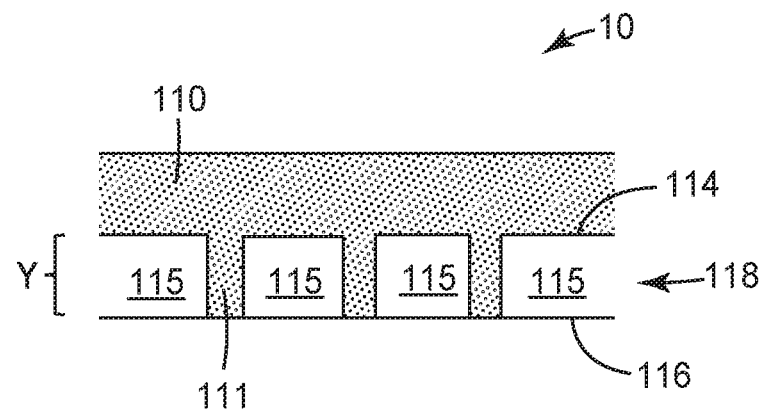
FIG. 1 is a schematic diagram side elevation view of an illustrative display film.

In the following detailed description, reference is made to the accompanying drawings that form a part hereof, and in which are shown by way of illustration for several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

The terms "display film", "protective film", and "protective display film" are herein used interchangeably.

"Transparent substrate" or "transparent layer" refers to a substrate or layer that has a high light transmission (typically greater than 90%) over at least a portion of the surface of the substrate over at least a portion of the light spectrum with wavelengths of about 350 to about 1600 nanometers, including the visible light spectrum (wavelengths of about 380 to about 750 nanometers).

"Polyurethane" refers to polymers prepared by the step-growth polymerization of hydroxyl-functional materials (materials containing hydroxyl groups —OH) with isocyanate-functional materials (materials containing isocyanate groups —NCO) and therefore contain urethane linkages (—O(CO)—NH—), where (CO) refers to a carbonyl group (C=O). The term may include "polyurethane-ureas" in which both urethane linkages and urea linkages are present.

"Polyacrylate" refers to polyacrylate or poly(meth)acrylate polymers prepared by the free radical polymerization of a precursor containing the reactive vinyl groups or vinylidene groups within acrylate end groups or (meth) acrylate end groups. Polyacrylate precursors include urethane acrylates which include both urethane and acrylate segments in the polymer chain.

"Polyurethane acrylate" refers to a polymer that includes primarily urethane and acrylate moieties or segments.

The phrase "glass transition temperature" refers herein to the onset of the glass transition as determined by the location of the peak for E", where the polyurethane sample was characterized by DMA at an oscillation of 0.2% strain and 1 Hz throughout a temperature ramp from −50° C. to 200° C. at a rate of 2° C. per minute.

The phrase "Tan Delta peak value" and peak temperature is measured according to the DMA analysis described in the Examples.

The present disclosure relates to display film with glass that may protect a display or display window and may survive flexing, folding or impact tests. The protective display film maintains optical properties of a display film while providing durability to the display. The present disclosure relates to a segmented display film or protective segmented display film that can protect a display window and survive folding tests intact. The segmented display film maintains optical properties while providing scratch resistance to the display. The display film includes a transparent glass layer comprising two or more co-planar glass layer segments and a thickness defined by a first major surface and a second major surface opposing the first major surface. The thickness may be less than 500 micrometers, or less than 250 micrometers, or less than 150 micrometers. Interstitial polymer material separates adjacent segments. A polymer layer or transparent energy dissipation layer is disposed on the first major surface. The interstitial polymer material may be index matched or substantially index matched with the glass segments. A transparent energy dissipation layer may be disposed on or coupled to the transparent glass layer. The transparent energy dissipation layer has a glass transition temperature of 27 degrees Celsius or less and a Tan Delta peak value of 0.5 or greater. The segmented display film may exhibit a haze value of 5% or less or 3% or less or 2% or less or 1% or less. The segmented display film may exhibit a visible light transmission of 85% or greater or 90% or greater, or 93% or greater. The segmented display film may exhibit a clarity of 95% or greater, or 97% or greater, or 99% or greater. The transparent energy dissipation layer may have a glass transition temperature of 15 degrees Celsius or less, or 10 degrees Celsius or less, or 5 degrees Celsius or less, or 0 degrees Celsius or less. The transparent energy dissipation layer may have a Tan Delta peak value in a range from 0.5 to 2.5 or from 1 to 2 or from 1.2 to 2. The segmented display film may withstand a bend radius of 5 mm or less, or 4 mm or less, or 3 mm or less, or 2 mm or less, or even 1 mm or less without failure or visible defects, such as delamination, cracking, or haze. While the present disclosure is not so limited, an appreciation of various aspects of the disclosure will be gained through a discussion of the examples provided below.

FIG. 1 is a schematic diagram side elevation view of an illustrative display film 10. The terms "display film", "cover film", "protective film", "protective cover film" or "protective display film" are used interchangeably herein. The display film 10 includes a transparent glass layer 118 including two or more co-planar glass layer segments 115 and a thickness Y defined by a first major surface 114 and a second major surface 116 opposing the first major surface 114. The glass layer 118 or glass layer segments 115 thickness may be less than 500 micrometers, or less than 300 micrometers, or less than 250 micrometers, or less than 200 micrometers, or less than 150 micrometers, or less than 100 micrometers. The thickness may be in a range from 20 micrometers to 250 micrometers, or from 25 micrometers to 150 micrometers, or from 50 micrometers to 100 micrometers. Interstitial polymer material 111 separates adjacent segments 115. A polymer layer 110 may be disposed on the first major surface 114 and form interstitial polymer material 111. The polymer layer 110 may have a thickness less than 200 micrometers, or less than 100 micrometers, or less than 50 micrometers, or less than 20 micrometers, or the polymer layer 110 thickness may be in a range from 1 micrometer to 200 micrometers, or from 5 micrometers to than 100 micrometers, or from 5 micrometers to 50 micrometers, or from 5 to 20 micrometers.

The polymer layer 110 may be index matched with the transparent glass layer 118 or glass layer segments 115. The polymer layer 110 may be formed of any polymer materials described herein. The polymer layer 110 is transparent and optically clear and is optically coupled to the transparent glass layer 118 or glass layer segments 115. The polymer layer 110 and interstitial polymer material 111 may form a protective layer, an energy dissipation layer, or an elastic layer. In some cases, the polymer layer 110 and interstitial polymer material 111 may be formed of the energy dissipation layer materials described below. In some cases, the polymer layer 110 and interstitial polymer material 111 may be formed of the protective layer materials described below. In other cases the polymer layer 110 and interstitial polymer material 111 may be formed of optically clear adhesive materials.

The interstitial polymer material 111 may be formed of a polymer material that is index matched or substantially index matched to the glass segments 115. The interstitial polymer material 111 has a first refractive index value and the glass segments 115 have a second refractive index value. The refractive index value may be within 0.1, or within 0.05, or within 0.02, or within 0.01 of the second refractive index value. Index matching or substantially index matching may assist in hiding the material transitions from glass to polymer or hiding the segment definition from a viewer.

The interstitial polymer material 111 may separate adjacent glass segments 115 by (a minimum lateral distance of) at least 25%, or at least 50%, or at least 75%, or at least 100% of the thickness (or average thickness) of the transparent glass layer 118. The interstitial polymer material 111 may separate adjacent glass segments 115 (minimum lateral distance) in a range from 25% to 200%, or from 50% to 100% of the thickness (or average thickness) of the transparent glass layer 118. The interstitial polymer material 111 may fix adjacent glass segments 115 to each other. The interstitial polymer material 111 may optically couple glass segments 115 to each other.

The glass segments 115 may have orthogonal edge surfaces defining the thickness of the glass segments 115. The glass segments 115 may have edge surfaces that are not orthogonal but are tapered. Adjacent glass segments 115 edge surfaces may be parallel with each other and be either orthogonal to the transparent glass layer 118 first major surface 114 or second major surface 116, or be tapered. Adjacent glass segments 115 edge surfaces may be tapered away from each other and may form a "V" shape in cross-section.

The interstitial polymer material 111 may be formed of the same or similar material as the material forming the transparent energy dissipation layer described below. The interstitial polymer material 111 may be formed of material this is different or a different type of material than the material forming the transparent energy dissipation layer.

Figure 2:
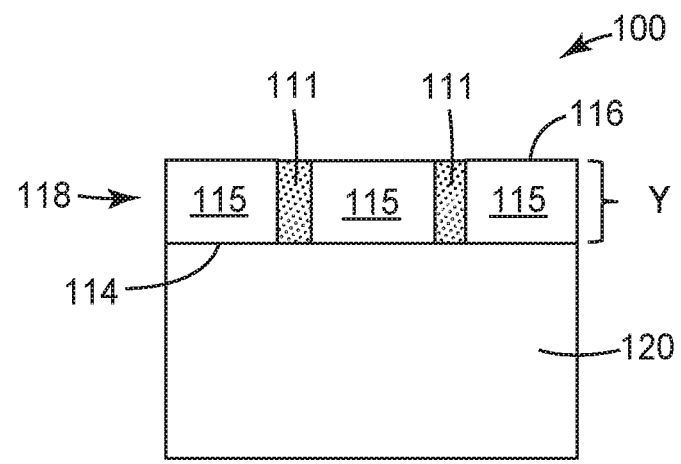
FIG. 2 is a schematic diagram side elevation view of an illustrative display film.

FIG. 2 is a schematic diagram side elevation view of an illustrative display film 100 where a transparent energy dissipation layer 120 is disposed on the first major surface 114 of the transparent glass layer 118 and glass segments 115. The interstitial polymer material 111 may be formed of the same or similar material forming the transparent energy dissipation layer 120. The interstitial polymer material 111 may be formed of a dis-similar material to the material forming the transparent energy dissipation layer 120.

Figure 3:
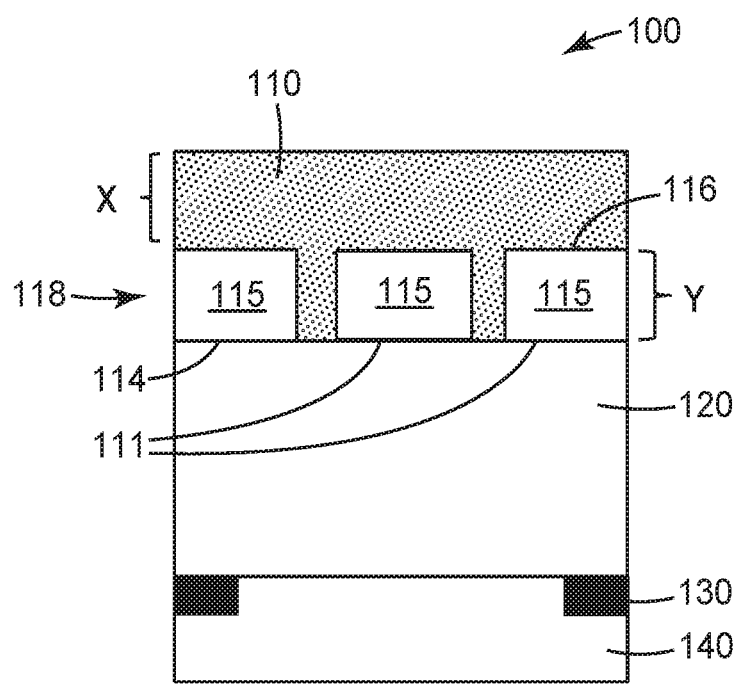
FIG. 3 is a schematic diagram side elevation view of another illustrative display film.

FIG. 3 is a schematic diagram side elevation view of another illustrative display film 100 where a polymer layer 110 is disposed on the second major surface 116 of the transparent glass layer 118 and glass segments 115 and a transparent energy dissipation layer 120 is disposed on the first major surface 114 of the transparent glass layer 118 and glass segments 115. The interstitial polymer material 111 may be formed of the same or similar material forming the polymer layer 110. The interstitial polymer material 111 may be formed of a dis-similar material to the material forming the polymer layer 110. The polymer layer 110 may be a protective layer (described below). The polymer layer 110 may have a thickness X in a range from 5 to 200 micrometers, or from 5 to 100 micrometers, or from 10 to 75 micrometers. An adhesive layer 140 may be disposed on the transparent energy dissipation layer 120. The transparent energy dissipation layer 120 may separate the transparent glass layer 118 from the adhesive layer 140.

The illustrative display film constructions described herein may include a colored border 130 that defines a viewing window. This border 130 may be produced by use of ink or may comprise a decorative film. The border 130 may be a continuous frame element printed, for example, onto the transparent energy dissipation layer, for example. The border or colored border 130 may be disposed on the transparent energy dissipation layer 120.

Figure 4:
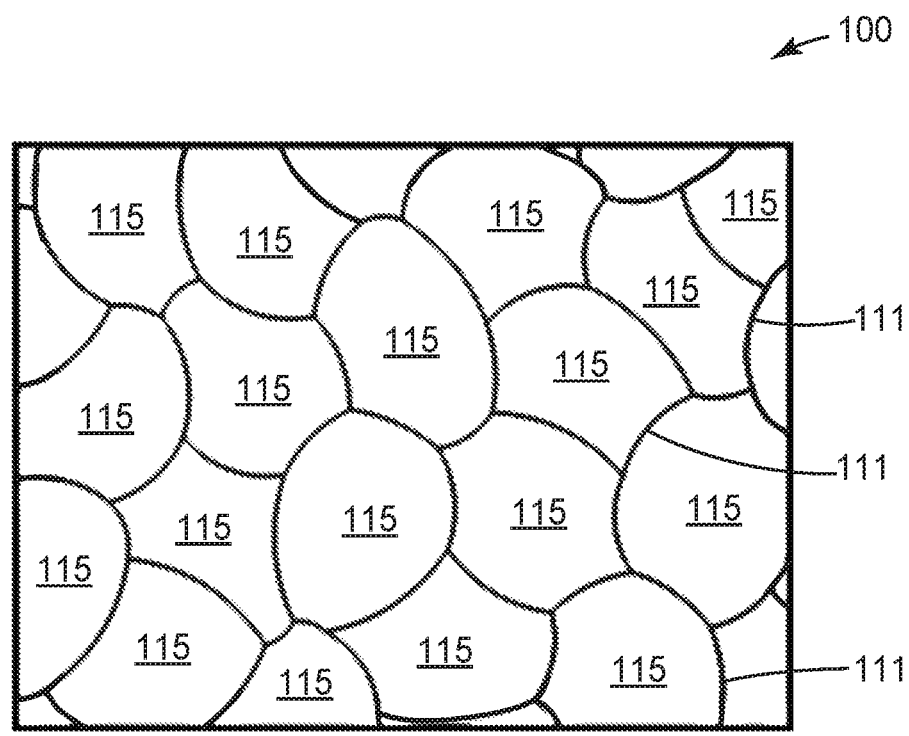
FIG. 4 is a schematic diagram front view of an illustrative display film bending region having random segments.

FIG. 4 is a schematic diagram front view of an illustrative display film 100 bending region having random segments 115. The glass layer segments 115 may be non-uniform segments or randomized segments that define a bending region of the display film 100. The glass segment pattern illustrated in FIG. 4 may be referred to as a "platelet" pattern. Non-uniform or randomized segments may assist in hiding the boundaries of the glass segments 115.

Figure 5:
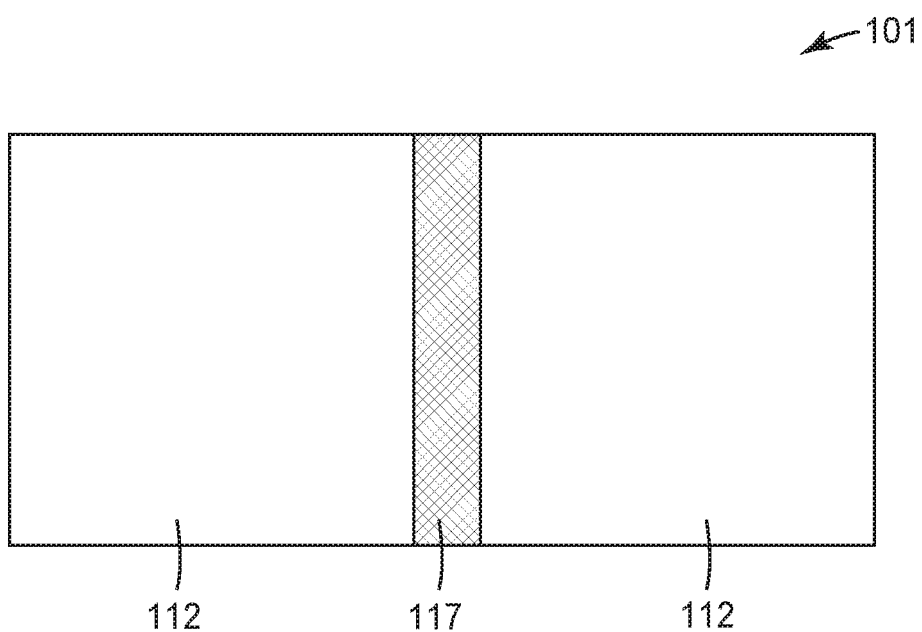
FIG. 5 is a schematic diagram front view of an illustrative display film having a bending region.

FIG. 5 is a schematic diagram front view of an illustrative display film 101 having a bending region 117. The glass layer segments 115 may define the bending region 117 and be configured to provide bending or folding of the glass layer 118 without fracturing the glass layer segments 115 or glass layer 118. The glass layer segments 115 forming the bending region 117 may be uniform, or non-uniform, or randomized segments, or a platlet pattern as illustrated in FIG. 4.

The glass layer segments 115 forming the bending region 117 may be parallel segments that extend along one entire dimension (length or width) of the display film. The parallel segments may each be a unitary element that is co-extensive with the one entire dimension (length or width) of the display film. These parallel segments may have a parallelepiped or cuboid shape. These parallel segments may have a prism shape. The parallel segments may be formed of two or more or a plurality of segments along the one entire dimension (length or width) of the display film. The parallel segments may form a tile or brick-like pattern along the one entire dimension (length or width) of the display film. Interstitial polymer material may separate adjacent segments along the one entire dimension (length or width) of the display film. The glass layer segments 115 forming the bending region 117 may be non-uniform, or random, or form a platelet pattern as illustrated in FIG. 4.

The display film may have one or more bending regions defined along the surface of the display film. The display film may have from 5% to 50%, or from 5% to 25% of the display surface area be defined by glass layer segments. The display film may have the entire surface (100%) defined by glass layer segments. The glass layer segments may have an aspect ratio (minimum lateral distance to thickness) in a range from 1:1 to 100:1, or in a range from 2:1 to 50:1, or in a range from 3:1 to 10:1.

The glass layer segments 115 that define the bending region 117 may be formed by any useful method. The glass layer segments 115 may be formed by mechanical fracturing. The glass layer segments 115 may be formed by chemical etching. The glass layer segments 115 may be formed by laser cutting. The glass layer segments 115 may be formed by mechanical fracturing. The glass layer segments 115 may be individually formed and then assembled to form the bending region 117.

Figure 6:
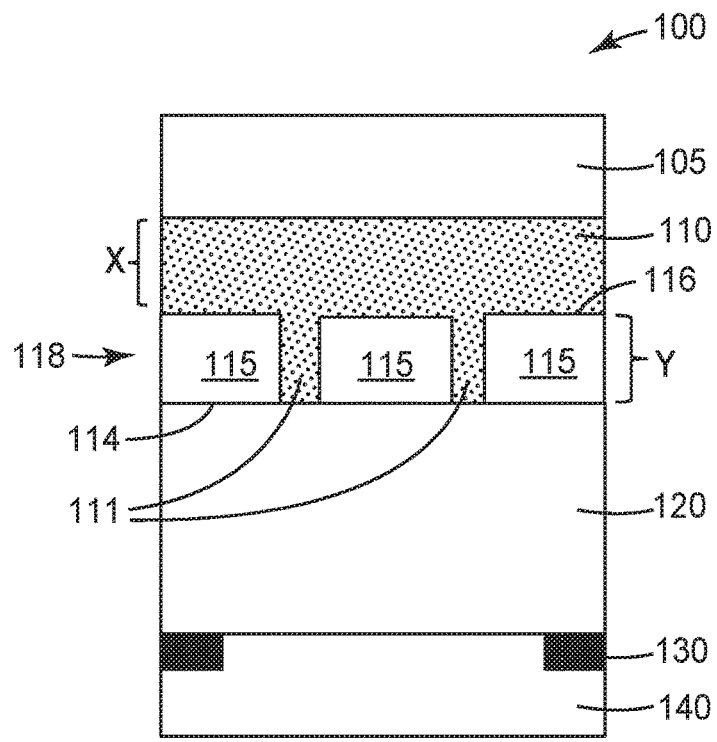
FIG. 6 is a schematic diagram side elevation view of another illustrative display film.

FIG. 6 is a schematic diagram side elevation view of another illustrative display film 100 where a polymer layer 110 is disposed on the second major surface 116 of the transparent glass layer 118 and glass segments 115 and a transparent energy dissipation layer 120 is disposed on the first major surface 114 of the transparent glass layer 118 and glass segments 115. A protective layer 105 is disposed on the polymer layer 110. The interstitial polymer material 111 may be formed of the same or similar material forming the polymer layer 110. The interstitial polymer material 111 may be formed of a dis-similar material to the material forming the polymer layer 110. The polymer layer 110 may have a thickness X in a range from 5 to 200 micrometers, or from 5 to 100 micrometers, or from 5 to 75 micrometers, or from 10 to 75 micrometers. An adhesive layer 140 may be disposed on the transparent energy dissipation layer 120. The transparent energy dissipation layer 120 may separate the transparent glass layer 118 from the adhesive layer 140. A border or colored border 130 may be included in the display film 100. The border or colored border 130 may be disposed on the transparent energy dissipation layer 120.

The protective layer 105 may provide abrasion resistance to the display film and may also be referred to as an abrasion resistant layer. A protective layer or abrasion resistant layer may include a hardcoat layer, a nanoparticle nanocomposite ionic elastomeric layer, or an elastic nanocomposite urethane layer. The protective layer 105 may include nanoparticles and cross-linked polymer. The protective layer 105 may have a thickness in a range from 2 to 30 micrometers, or from 2 to 15 micrometers, or from 3 to 10 micrometers.

Figure 7:
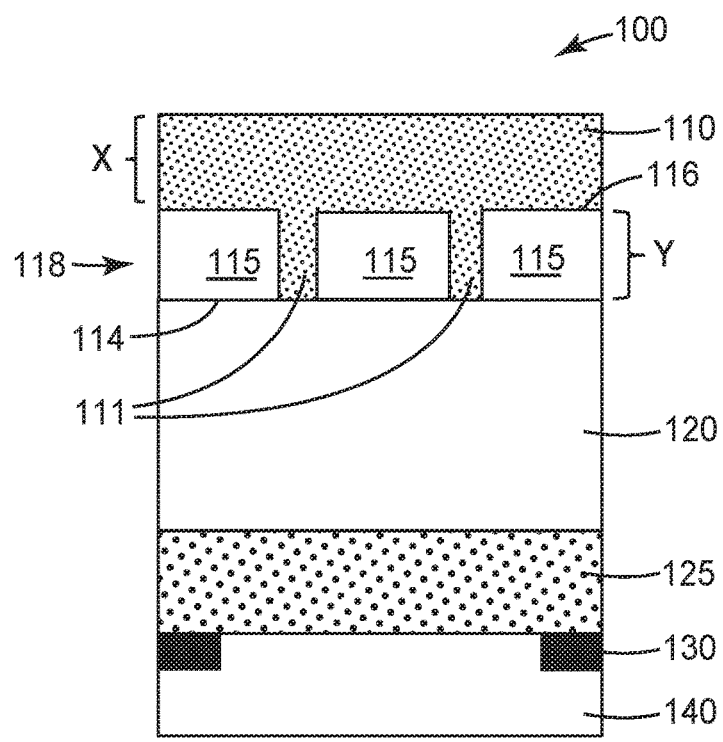
FIG. 7 is a schematic diagram side elevation view of another illustrative display film.

FIG. 7 is a schematic diagram side elevation view of another illustrative display film 100 that includes a transparent substrate 125 separating the transparent energy dissipation layer 120 from the adhesive layer 140. A polymer layer 110 may be disposed on the second major surface 116 of the transparent glass layer 118 and glass segments 115 and a transparent energy dissipation layer 120 may be disposed on the first major surface 114 of the transparent glass layer 118 and glass segments 115. The interstitial polymer material 111 may be formed of the same or similar material forming the polymer layer 110. The interstitial polymer material 111 may be formed of a dis-similar material to the material forming the polymer layer 110. The polymer layer 110 may define a protective layer and be formed of protective layer materials described below. The polymer layer 110 may have a thickness X in a range from 5 to 200 micrometers, or from 5 to 100 micrometers, or from 10 to 75 micrometers. An adhesive layer 140 may be disposed on the transparent energy dissipation layer 120. The transparent energy dissipation layer 120 may separate the transparent glass layer 118 from the adhesive layer 140. A border or colored border 130 may be included in the display film 100. The border or colored border 130 may be disposed on the transparent energy dissipation layer 120.

The transparent polymeric substrate layer 125 may have any useful thickness. In many embodiments the transparent polymeric substrate layer 125 has a thickness in a range from 10 to 100 micrometers or from 20 to 80 micrometers. The transparent polymeric substrate layer 125 may be formed of any useful polymeric material that provides the desired mechanical properties (such as dimensional stability) and optical properties (such as light transmission and clarity) to the display film. Examples of materials suitable for use in the polymeric substrate layer 125 include polymethylmethacrylate, polycarbonate, polyamides, polyimide, polyesters (PET, PEN), polycyclic olefin polymers, and thermoplastic polyurethanes.

The transparent polymeric substrate layer 125 may be primed or treated to impart some desired property to one or more of its surfaces. In particular the transparent polymeric substrate layer 125 can be primed to improve adhesion of the transparent energy dissipation layer 120 with the transparent polymeric substrate layer 125. Examples of such treatments include corona, flame, plasma and chemical treatments such as, acrylate or silane treatments.

The transparent polymeric substrate layer 125 may have any useful tensile modulus or offset yield stress value. The transparent polymeric substrate layer 125 may have an offset yield stress value that is greater than 50 MPa or greater than 75 MPa. The phrase "yield stress" or "offset yield stress" refers herein to "0.2% offset yield strength" as defined in ASTM D638-14. ASTM D638-14 section A2.6 defines the test method for "offset yield strength" and is defined as the stress at which the strain exceeds by a specified amount (the offset) an extension of the initial proportional portion of the stress-strain curve. It is expressed in force per unit area, usually megapascals (poundsforce per square inch).

Figure 8:
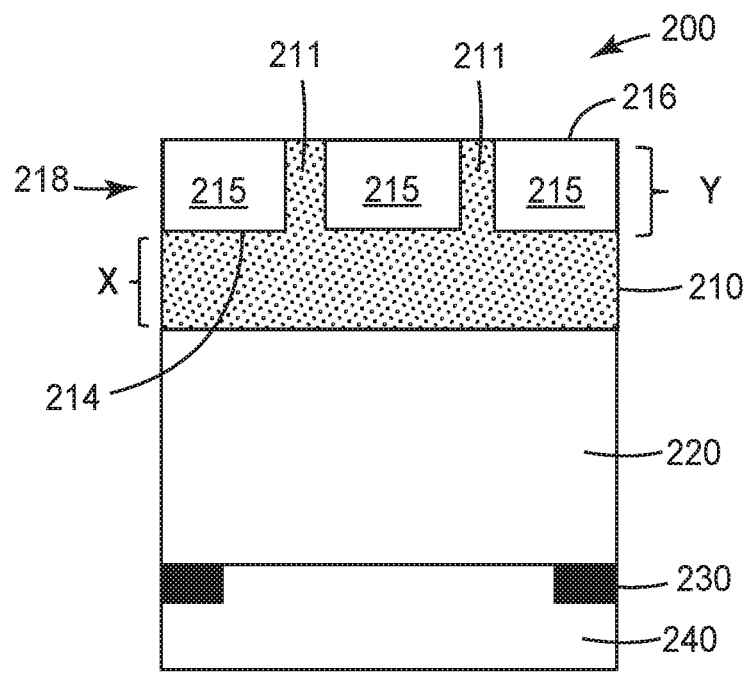
FIG. 8 is a schematic diagram side elevation view of another illustrative display film.

FIG. 8 is a schematic diagram side elevation view of another illustrative display film 200. A transparent glass layer 218 may be formed of two or more co-planar glass layer segments 215 having a thickness Y defined by a first major surface 214 and a second major surface 216 opposing the first major surface 214. The thickness may be less than 500 micrometers, or in a range from 25 micrometers to 250 micrometers, or in a range from 25 micrometers to 150 micrometers. A polymer layer 210 is disposed on the first major surface 214. The polymer layer 210 is formed of a polymer material and the polymer material also forms interstitial polymer material 211 separating adjacent segments 215. A transparent energy dissipation layer 220 is disposed on the polymer layer 210. The polymer layer 210 separates the transparent energy dissipation layer 220 from the transparent glass layer 218. The transparent energy dissipation layer 210 has a glass transition temperature of 27 degrees Celsius or less and a Tan Delta peak value of 0.5 or greater. An adhesive layer 240 may be disposed on the transparent energy dissipation layer 220.

The transparent energy dissipation layer 220 may separate the transparent glass layer 218 from the adhesive layer 240. A border or colored border 230 may be included in the display film 200. The border or colored border 230 may be disposed on the transparent energy dissipation layer 220.

Figure 9:
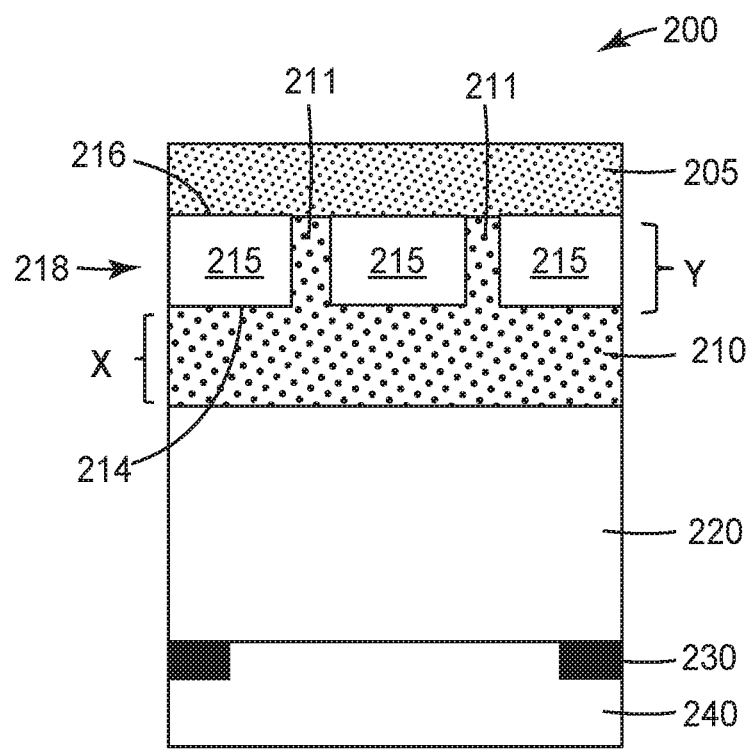
FIG. 9 is a schematic diagram side elevation view of another illustrative display film.

FIG. 9 is a schematic diagram side elevation view of another illustrative display film 200 including a protective layer 205. A protective layer 205 is disposed on the second surface 216 of the glass layer 218. The interstitial polymer material 211 may be formed of the same or similar material forming the polymer layer 210. The interstitial polymer material 211 may be formed of a dis-similar material to the material forming the polymer layer 210. The polymer layer 210 may have a thickness X in a range from 5 to 200 micrometers, or from 5 to 100 micrometers, or from 10 to 75 micrometers. An adhesive layer 240 may be disposed on the transparent energy dissipation layer 220. The transparent energy dissipation layer 220 may separate the transparent glass layer 218 from the adhesive layer 240. A border or colored border 230 may be included in the display film 200. The border or colored border 230 may be disposed on the transparent energy dissipation layer 220.

The protective layer 205 may provide abrasion resistance to the display film and may also be referred to as an abrasion resistant layer. A protective layer or abrasion resistant layer may include a hardcoat layer, a nanoparticle nanocomposite ionic elastomeric layer, or an elastic nanocomposite urethane layer. The protective layer 205 may include nanoparticles and cross-linked polymer. The protective layer 205 may have a thickness in a range from 2 to 30 micrometers, or from 2 to 15 micrometers, or from 3 to 10 micrometers.

Figure 10:
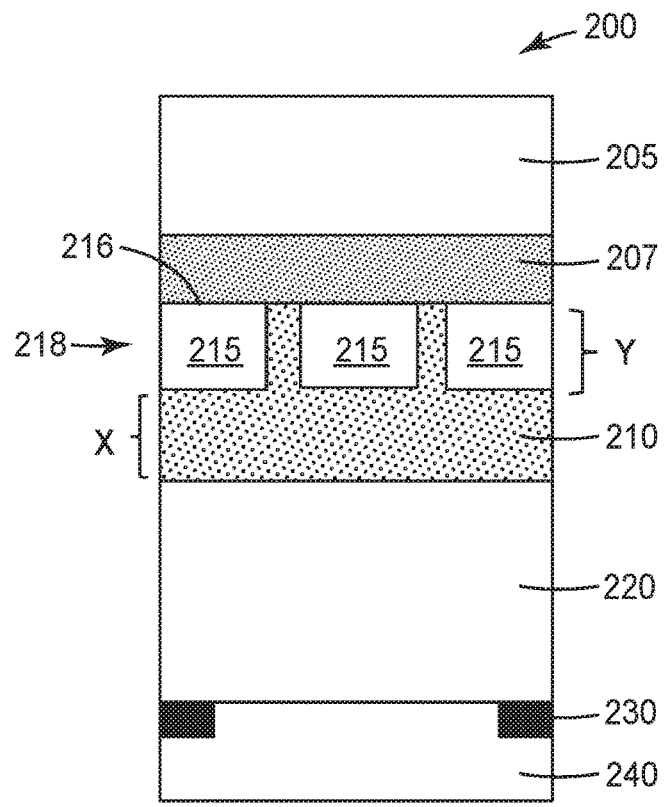
FIG. 10 is a schematic diagram side elevation view of another illustrative display film.

FIG. 10 is a schematic diagram side elevation view of another illustrative display film 200 having a removable protective layer 205. A protective layer 205 is coupled to the second surface 216 of the glass layer 218 via an optical adhesive layer 207. The optical adhesive layer 207 may provide for clean removal of the protective layer 205 and optical adhesive layer 207 from the second surface 216 of the glass layer 218.

The adhesive layer 140, 240 may be an optical adhesive. The adhesive layer 140, 240 may be a pressure sensitive adhesive. The adhesive layer 140, 240 may be included in any of the display film constructions described herein. Release liners may be disposed on the outer major surfaces of any of the display film constructions described herein. The release liners may also be referred to as "premask" layers that may be easily removed for application to an optical display or to reveal the display film, before or after placement onto an optical display. The optical adhesive layer may be formed of acrylate, silicone, silicone polyoxamide, silicone polyurea, polyolefin, polyester, polyurethane or polyisobutylene.

The removable liners (or premask layers) may provide transport protection to the underlying display film 100, 200 and optional optical adhesive layer 140, 240. The removable liners may have a layer or surface that has a low surface energy to allow clean removal of the liner from the display film and optional optical adhesive layer 140, 240. The removable liners may be a layer of polyester coated with a silicone, for example. The removable liner may provide temporary structure to the optional optical adhesive layer 140, 240. For example, WO2014/197194 and WO2014/197368 describe removable liners that emboss an optical adhesive layer where the optical adhesive losses its structures once the removable liner is stripped away from the optical adhesive layer.

Figure 11:
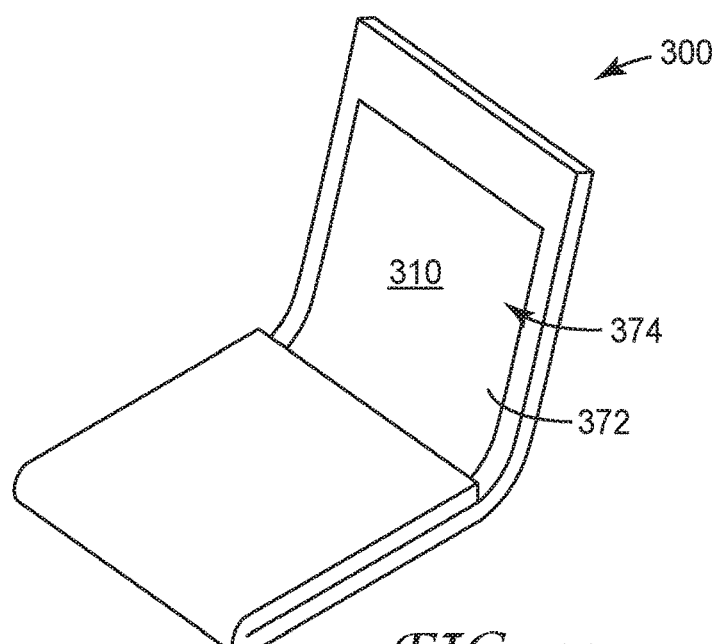
FIG. 11 is a schematic diagram perspective view of an illustrative folding article including an illustrative display film.

FIG. 11 is a schematic diagram perspective view of an illustrative folding article 300 including an illustrative display film 310. The display film 310 may be any of the display film constructions described herein disposed on an optical element such as an optical display 374. The display device may not be a folding article and may only flex within a certain range, or may be a static curved display device. The display device may fold along the folding region defined by the placement of the glass layer segments.

An optical display 374 may form at least a portion of display device. The display device 370 may include a display window 372. The display device 370 can be any useful article such as a phone or smartphone, electronic tablet, electronic notebook, computer, and the like. The optical display may include an organic light emitting diode (OLED) display panel. The optical display may include a liquid crystal display (LCD) panel or a reflective display. Examples of reflective displays include electrophoretic displays, electrofluidic displays (such as an electrowetting display), interferometric displays or electronic paper display panels, and are described in US 2015/0330597. Further examples of optical displays include static display such as commercial graphic signs and billboards.

The display film 310 and the optical display 374 may be foldable so that the optical display 374 faces itself and at least a portion of display film 310 contacts or directly faces another portion of the protective film 310, as illustrated in FIG. 11. The display film 310 and the optical display 374 may be flexible or bendable or foldable so that a portion of the display film 310 and the optical display 374 can articulate relative to another portion of the display film 310 and the optical display 374. The display film 310 and the optical display 374 may be flexible or bendable or foldable so that a portion of the display film 310 and the optical display 374 can articulate at least 90 degrees or at least 170 degrees relative to another portion of the display film 310 and the optical display 374.

The display film 310 and the optical display 374 may be flexible or bendable or foldable so that a portion of the display film 310 and the optical display 374 can articulate relative to another portion of the display film 310 and optical display 374 to form a bend radius of 3 mm or less in the display film 310 at the bend or fold line. The display film 310 and the optical display 374 may be flexible or bendable or foldable so that a portion of the display film 310 and optical display 374 can articulate relative to another portion of the display film 10 and the optical display 374 to form a bend radius such that the display film 310 overlaps itself and is separated from each other by a distance on 10 mm or less, or 6 mm or less or 3 mm or less or contacts each other. While FIG. 11 shows the display device 374 folding inward, where the surface of the display film 310 approach each other, there are other cases in which the display device may fold in the opposite or outward direction (out-folding) such that the display film 310 is on the outer surface of the display device.

The protective films described herein may be constructed in a number of ways, but may include an energy dissipation layer that provides beneficial properties in impact while not leading to failure in dynamic folding events, even at low temperatures.

The display film may have a haze value of less than 5%, or less than 3%, or less than 2%, or less than 1%. The display film may have a clarity of greater than 90%, or greater than 95%, or greater than 98%. The display film may have a visible light transmission of greater than 85%, or greater than 90%, or greater than 93%.

The display film may have a yellow index or b* value of 5 or less, or 4 or less, or 3 or less, or 2 or less, or 1 or less. In many embodiments the display film may have a yellow index or b* value of 1 or less.

The display film may have any useful thickness. In many embodiments the display film has a thickness of 500 micrometers or less, or 400 micrometers or less, or 300 micrometers or less, or 200 micrometers or less. The display film may have a thickness in a range from 85 micrometers to 350 micrometers, or from 100 micrometers to 250 micrometers, or from 100 micrometers to 200 micrometers. The thickness of the display film is a balance between being thick enough to provide the desired display protection and thin enough to provide the folding and reduced thickness design parameters.

The display film may include one or more additional layers. Additional layers may include conductive layers for touch sensitive display elements or barrier layers. One or more additional transparent polymeric substrate layers may be disposed in the display film of any useful polymeric material that provides desired mechanical properties (such as dimensional stability) and optical properties (such as light transmission and clarity) to the display film. Examples of materials suitable for use in the polymeric substrate layer include polymethylmethacrylate, polycarbonate, polyamides, polyimide, polyesters (PET, PEN), polycyclic olefin polymers, and thermoplastic polyurethanes.

The optional one or more barrier layers may include a transparent barrier layer. The transparent barrier layer may be disposed on the substrate or the protective layer or the energy dissipation layer. The transparent barrier layer can mitigate or slow ingress of oxygen or water through the display film. Transparent barrier layers may include for example, thin alternating layers of silica, alumina or zirconia together with an organic resin. Exemplary transparent barrier layer are described in U.S. Pat. No. 7,980,910 and WO2003/094256.

Optional additional layers may include a microstructure layer, an anti-glare layer, anti-reflective layer, or an anti-fingerprint layer. Additional optional layers may be disposed in the interior of the display film. One useful additional layer disposed within the display film is a sparkle reduction layer as described in WO2015/191949. The sparkle reduction layer may be particularly useful with high definition displays that include anti-glare coatings.

The transparent glass layer 118, 218 and glass layer segments 115, 215 may be formed of any useful glass material. The glass may be treated to provide beneficial properties. For example, the glass may be ion implanted, chemically strengthened or tempered, and the like. The transparent glass layer 118, 218 and glass layer segments 115, 215 may have a thickness 500 micrometers, or less than 300 micrometers, or less than 250 micrometers, or less than 200 micrometers, or less than 150 micrometers, or less than 100 micrometers. The thickness may be in a range from 20 micrometers to 250 micrometers, or from 25 micrometers to than 150 micrometers, or from 50 micrometers to 100 micrometers. Suppliers of thin transparent glass include Corning, Nippon Electric Glass, Schott and Asahi Glass. The term "glass" also refers herein to sapphire.

The transparent glass layer 118, 218 and glass layer segments 115, 215 may be primed or treated to impart some desired property to one or more of its surfaces. In particular, the transparent glass layer 118, 218 and glass layer segments 115, 215 may be primed to improve adhesion of the transparent glass layer 118, 218 and glass layer segments 115, 215 with the polymer layer 110, 111, 210, 211, or energy dissipation layer 120, 220, or any of the layers described herein. Examples of such treatments include corona, flame, plasma and chemical treatments such as, acrylate or silane treatments.

The adhesive layer 140, 240 may be an optical adhesive. The adhesive layer 140, 240 may be a pressure sensitive adhesive. The adhesive layer 140, 240 may be included in any of the display film constructions described herein. The optical adhesive layer may be formed of acrylate, silicone, silicone polyoxamide, silicone polyurea, polyolefin, polyester, polyurethane or polyisobutylene.

The protective films described herein may be constructed in a number of ways, but may include an energy dissipation layer that provides beneficial properties in impact while not leading to failure in dynamic folding events, even at low temperatures.

The transparent energy dissipation layer 120, 220 may have any useful thickness. In many embodiments the transparent energy dissipation layer 120, 220 has a thickness of 100 micrometers or greater, or in a range from 100 to 300 micrometers or from 100 to 250 micrometers. The thickness of the transparent energy dissipation layer 120, 220 is a balance between being thick enough to provide the desired protection to the display and particularly to the transparent polymeric substrate layer 120, 220 and thin enough to provide the folding and reduced thickness design parameters.

The energy dissipation layer may have a glass transition temperature of 27 degrees Celsius or less, or less than 10 degrees Celsius, or less than 5 degrees Celsius. The energy dissipation layer may have a low glass transition temperature, such as 5 degrees Celsius less, or zero degrees Celsius or less, or −5 degrees Celsius or less, or −10 degrees Celsius or less or in a range from −40 to 5 degrees Celsius, or in a range from −30 to 5 degrees Celsius, or in a range from −20 to 5 degrees Celsius, or in a range from −15 to 5 degrees Celsius, or in a range from −10 to 5 degrees Celsius, or in a range from −5 to 5 degrees Celsius. Glass transition temperature is herein characterized using Dynamic Mechanical Analysis using E".

The energy dissipation layer may be formed of a plurality of layers, and at least two of these layers having a different glass transition temperature value. These layers may have a different glass transition temperature value by at least 2 degrees Celsius, or at least 5 degrees Celsius, or at least 10 degrees Celsius, for example. In some cases, each energy dissipation layer peak Tan Delta values may occur at different frequencies at a specified temperature.

The energy dissipation layer may have a Tan Delta peak value of 0.5 or greater, or 0.8 or greater, or 1.0 or greater, or 1.2 or greater, or from 0.5 to 2.5, or from 1 to 2.5, or from 1 to 2. The energy dissipation layer or layers have a Young's Modulus (E') greater than 0.9 MPa over the temperature range −40 degrees Celsius to 70 degrees Celsius. The energy dissipation layer would not be referred to as a pressure sensitive adhesive.

The transparent energy dissipation layer may include a cross-linked polyurethane, or cross-linked polyurethane acrylate, or cross-linked polyurethane and polyacrylate.

The transparent energy dissipation layer 120, 220 may be formed with a transparent cross-linked polyurethane layer. The transparent cross-linked polyurethane layer preferably includes chemically or covalently crosslinked materials derived from step growth polymerization of isocyanate and polyol oligomers. Selection of reactant isocyanates and polyols may modify the glass transition temperature of the resulting cured polyurethane. The cross-linked polyurethane layer may be coated onto a transparent substrate or glass layer (that may be primed) and then be cured or cross-linked to form a thermoset polyurethane layer. Alternatively, the cross-linked polyurethane layer could be produced as a film that is then laminated to a substrate or glass layer in a subsequent process step. Such lamination could be assisted with heat, vacuum, or through the use of an adhesive or combination thereof.

Polyurethane is a polymer composed of organic units joined by carbamate (urethane) links. The polyurethanes described herein are thermosetting polymers that do not melt when heated. Polyurethane polymers may be formed by reacting a di- or polyisocyanate with a polyol. Both the isocyanates and polyols used to make polyurethanes contain on average two or more functional groups per molecule. The polyurethanes described herein may have a functionality greater than 2.4 or 2.5.

A wide variety of polyols may be used to form the aliphatic cross-linked polyurethane component of the transparent energy dissipation layer. The term polyol includes hydroxyl-functional materials that generally include at least 2 terminal hydroxyl groups. Polyols include diols (materials with 2 terminal hydroxyl groups) and higher polyols such as triols (materials with 3 terminal hydroxyl groups), tetraols (materials with 4 terminal hydroxyl groups), and the like. Typically the reaction mixture contains at least some diol and may also contain higher polyols. Higher polyols are particularly useful for forming crosslinked polyurethane polymers. Diols may be generally described by the structure HO—B—OH, where the B group may be an aliphatic group, an aromatic group, or a group containing a combination of aromatic and aliphatic groups, and may contain a variety of linkages or functional groups, including additional terminal hydroxyl groups.

Polyester polyols are particularly useful. Among the useful polyester polyols useful are linear and non-linear polyester polyols including, for example, polyethylene adipate, polybutylene succinate, polyhexamethylene sebacate, polyhexamethylene dodecanedioate, polyneopentyl adipate, polypropylene adipate, polycyclohexanedimethyl adipate, and poly ε-caprolactone. Particularly useful are aliphatic polyester polyols available from King Industries, Norwalk, Conn., under the trade name "K-FLEX" such as K-FLEX 188 or K-FLEX A308.

A wide variety of polyisocyanates may be used to form the aliphatic cross-linked polyurethane component of the transparent energy dissipation layer. The term polyisocyanate includes isocyanate-functional materials that generally include at least 2 terminal isocyanate groups. Polyisocyanates include diisocyanates (materials with 2 terminal isocyanate groups) and higher polyisocyanates such as triisocyanates (materials with 3 terminal isocyanate groups), tetraisocyanates (materials with 4 terminal isocyanate groups), and the like. Typically the reaction mixture contains at least one higher isocyanate if a difunctional polyol is used. Higher isocyanates are particularly useful for forming cross-linked polyurethane polymers. Diisocyanates may be generally described by the structure OCN—Z—NCO, where the Z group may be an aliphatic group, an aromatic group, or a group containing a combination of aromatic and aliphatic groups.

Higher functional polyisocyanates are particularly useful, such as triisocyanates, to form a crosslinked polyurethane polymer. Triisocyanates include, but are not limited to, polyfunctional isocyanates, such as those produced from biurets, isocyanurates, adducts, and the like. Some commercially available polyisocyanates include portions of the DESMODUR and MONDUR series from Bayer Corporation, Pittsburgh, Pa., and the PAPI series from Dow Plastics, a business group of the Dow Chemical Company, Midland, Mich. Particularly useful triisocyanates include those available from Bayer Corporation under the trade designations DESMODUR N3300A and MONDUR 489. One particularly suitable aliphatic polyisocyanate is DESMODUR N3300A.

The reactive mixture used to form the transparent aliphatic cross-linked polyurethane component of the transparent energy dissipation layer also contains a catalyst. The catalyst facilitates the step-growth reaction between the polyol and the polyisocyanate. Conventional catalysts generally recognized for use in the polymerization of urethanes may be suitable for use with the present disclosure. For example, aluminum-based, bismuth-based, tin-based, vanadium-based, zinc-based, or zirconium-based catalysts may be used. Tin-based catalysts are particularly useful. Tin-based catalysts have been found to significantly reduce the amount of outgassing present in the polyurethane. Most desirable are dibutyltin compounds, such as dibutyltin diacetate, dibutyltin dilaurate, dibutyltin diacetylacetonate, dibutyltin dimercaptide, dibutyltin dioctoate, dibutyltin dimaleate, dibutyltin acetonylacetonate, and dibutyltin oxide. In particular, the dibutyltin dilaurate catalyst DABCO T-12, commercially available from Air Products and Chemicals, Inc., Allentown, Pa. is particularly suitable. The catalyst is generally included at levels of at least 200 ppm or even 300 ppm or greater. The catalyst may be present in the final formed films at levels of at least 100 ppm or in a range from 100-500 ppm.

The cross-linked polyurethane fraction of the energy dissipation layer may have a cross-link density in a range from 0.1 to 1.0 mol/kg or from 0.2 to 0.9 mol/kg or from 0.37 to 0.74 mol/kg. The crosslink density of the cured polyurethane is calculated using the method described in Macromolecules, Vol. 9, No. 2, pages 206-211 (1976). To implement this model, integral values for chemical functionality are required. DESMODUR N3300 is reported to have an average functionality of 3.5 and an isocyanate equivalent weight of 193 g/equiv. This material was represented in the mathematical model as a mixture of 47.5 wt % HDI trimer (168.2 g/equiv.), 25.0 wt % HDI tetramer (210.2 g/equiv.), and 27.5 wt % of HDI pentamer (235.5 g/equiv.). This mixture yields an average equivalent weight of 193 g/equiv. and an average functionality of 3.5. Desmodur N3400 is reported to have an average functionality 2.5 and an equivalent weight of 193, and it is reported to be blend of the HDI isocyanurate trimer and HDI uretdione dimer. This material was represented in the mathematical model as a mixture of 19 wt % HDI isocyanurate trimer, 33 wt % HDI uretdione dimer, and 10 wt % of HDI uretdione trimer and 38 wt % of HDI tetramer having one isocyanurate group and one uretdione group. In the mathematical model, the functionality was determined by the sum the isocyanate groups and the uretdione groups in the cases where there was an excess of hydroxyl groups relative to the sum of the isocyanate and uretdione groups.

To produce an energy dissipation layer with a glass transition temperature below 10° C., it can be preferable to limit the amount of the isocyanate component. In some embodiments using HDI-derived isocyanates, it can be preferable to use less than 40 wt % isocyanate component based on the total core layer composition, or less than 38 wt %, or less than 35 wt %. In some embodiments, it is preferable to use an isocyanate component containing uretdione groups. When uretdione groups are included, it can be preferable to use an excess of hydroxyl functional groups relative to isocyanate groups. The excess hydroxyl groups can react with the uretdione groups to form allophanate groups to provide cure and chemical crosslinking. In some embodiments, it is preferable to include only a single polyol component to produce a narrow tan delta peak. In some embodiments, it is preferable to use a polyol component and an isocyanate component that are miscible with each other at room temperature.

The transparent energy dissipation layer 120, 220 may be formed with urethane acrylate oligomers. Urethane acrylate oligomers may be comprised of a wide variety of urethane materials with acrylate or methacrylate reactive groups. Urethane acrylate oligomers are commercially available from vendors such as, for example, Sartomer of Exton, Pa. (a subsidiary of Arkema) and Allnex (Ebecryl Brand name).

Examples of commercially available aliphatic urethane oligomers include but are not limited to CN9002, CN9004, CN9893, and CN3211 available from Sartomer Company and those sold under the Ebecryl brand name.

The transparent energy dissipation layer 120, 220 may be formed by mixing the polyurethane precursor components with polyacrylate precursor components. The polyurethane and the polyacrylate polymers are formed via distinct initiators. This allows the polyacrylate polymer to be selectively formed without forming the polyurethane polymer. The polyurethane polymer may be formed with the use of a catalyst (thermal curing) and the polyacrylate may be formed with the use of a photoinitator (UV or light curing), for example.

The transparent energy dissipation layer precursor (containing both the polyurethane precursor components with the polyacrylate precursor components with both photoinitiator and catalyst) may be coated onto the transparent polymeric substrate layer (that may be primed) or the glass layer and then the polyacrylate polymer may be selectively polymerized or cross-linked (via UV curing) to form a b-stage layer. Then this b-stage layer can be cured or cross-linked to form the thermoset or cross-linked polyurethane polymer and complete the formation of the transparent energy dissipation layer.

The transparent energy dissipation layer may contain from 1 to 50% wt polyacrylate polymer. The transparent energy dissipation layer may contain from 50 to 99% wt cross-linked polyurethane polymer. The transparent energy dissipation layer may contain from 1 to 20% wt polyacryate polymer. The transparent energy dissipation layer may contain from 2 to 15% wt polyacryate polymer. The transparent energy dissipation layer may contain from 3 to 10% wt polyacryate polymer. The transparent energy dissipation layer may contain from 80 to 99% wt cross-linked polyurethane polymer. The transparent energy dissipation layer may contain from 85 to 98% wt cross-linked polyurethane polymer. The transparent energy dissipation layer may contain from 90 to 97% wt cross-linked polyurethane polymer. The transparent energy dissipation layer may contain both a photoinitiator and a catalyst.

When the transparent energy dissipation layer contains less than about 10% wt polyacrylate (based on wt % of polyacrylate precursor material in the precursor mixture), it is believed that the polyacrylate defines a mainly a linear or branched polymer. When the transparent energy dissipation layer contains about 10% wt to about 20% wt polyacrylate (based on wt % of polyacrylate precursor material in the precursor mixture), it is believed that the polyacrylate defines a branched or cross-linked polymer. When the transparent energy dissipation layer contains about 20% wt to about 50% wt polyacrylate (based on wt % of polyacrylate precursor material in the precursor mixture), it is believed that the polyacrylate defines mainly a cross-linked polymer. Cross-linked polyacrylate may define an interpenetrating network with the cross-linked polyurethane in the transparent energy dissipation layer.

The polyacrylate polymer is polymerized or cross-linked. The polyacrylate polymer may be formed of acrylate monomers or oligomers. In some embodiments, the polyacrylate is a polyacrylate homopolymer. The acrylate monomers or oligomers are multifunctional to enable polymerization or cross-linking of the polyacrylate polymer. The polyacrylate polymer may be formed with the aid of an initiator, such as a photo-initiator, for example. The polyacrylate polymer may be formed of oligomers that include acrylate and urethane segments, or acrylate and urethane compatible segments. The polyacrylate polymer may be aliphatic.

The polyacrylate polymer may be formed of multifunctional (meth)acrylic monomers, oligomers, and polymers, where the individual resins can be difunctional, trifunctional, tetrafunctional or higher functionality. Useful multifunctional acrylate monomers and oligomers include:

(a) di(meth)acryl containing monomers such as 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, tripropylene glycol diacrylate;

(b) tri(meth)acryl containing monomers such as glycerol triacrylate, trimethylolpropane triacrylate, ethoxylated triacrylates (e.g., ethoxylated trimethylolpropane triacrylate), propoxylated triacrylates (e.g., propoxylated glyceryl triacrylate, propoxylated trimethylolpropane triacrylate), trimethylolpropane triacrylate, tris(2-hydroxyethyl)isocyanurate triacrylate;

(c) higher functionality (meth)acryl containing monomer such as ditrimethylolpropane tetraacrylate, dipentaerythritol pentaacrylate, pentaerythritol triacrylate, ethoxylated pentaerythritol tetraacrylate, and caprolactone modified dipentaerythritol hexaacrylate.

Oligomeric (meth)acryl monomers such as, for example, urethane acrylates may also be employed.

Such (meth)acrylate monomers are widely available from vendors such as, for example, Sartomer Company of Exton, Pa.; Cytec Industries of Woodland Park, N; and Aldrich Chemical Company of Milwaukee, Wis.

In some embodiments, the polyacrylate polymer includes a (meth)acrylate monomer comprising at least three (meth) acrylate functional groups. In some embodiments, the cross-linking monomer comprises at least four, five or six (meth) acrylate functional groups. Acrylate functional groups may be favored over (meth)acrylate functional groups.

Preferred functional acrylates include for example trimethylolpropane triacrylate (commercially available from Sartomer Company, Exton, Pa. under the trade designation "SR351"), ethoxylated trimethylolpropane triacrylate (commercially available from Sartomer Company, Exton, Pa. under the trade designation "SR454"), pentaerythritol tetraacrylate, pentaerythritol triacrylate (commercially available from Sartomer under the trade designation "SR444"), dipentaerythritol pentaacrylate (commercially available from Sartomer under the trade designation "SR399"), ethoxylated pentaerythritol tetraacrylate (from Sartomer under the trade designation "SR494"), dipentaerythritol hexaacrylate, and tris(2-hydroxy ethyl) isocyanurate triacrylate (from Sartomer under the trade designation "SR368".

Aliphatic urethane acrylate oligomers may be utilized to form a preferred polyacrylate polymer to enhance compatibility of the polyacrylate polymer and the cross-linked polyurethane, although other aliphatic polyacrylate monomers may also be useful. The polyacrylates or polyurethane acrylates described herein are thermosetting polymers.

The polyacrylate polymer may be formed by free radical polymerization of multifunctional urethane acrylate oligomers. The urethane acrylate oligomer may be mixed with other low molecular weight monofunctional and/or multifunctional acrylates to modify the pre-cured viscosity of the resin for the purposes of processing. Generally the average functionality of the multifunctional acrylate used in the energy dissipation layer prior to cure is less than 3 (i.e. 3 functional acrylate functional groups per molecule) or can be 2 or less. The cured (or crosslinked) material may exhibit stable material properties with respect to the display film use in application, that is, the energy dissipation layer may not exhibit appreciable flow.

The display film may include a protective layer. The protective layer provides abrasion resistance to the display film and may also be referred to as an abrasion resistant layer. A protective layer or abrasion resistant layer includes a hardcoat layer, a nanoparticle nanocomposite ionic elastomeric layer, an elastic nanocomposite urethane layer, or a glass layer.

Abrasion is a method of wearing down or rubbing away material by means of friction. The abrasion resistance of a material helps it to withstand mechanical action and tends to protect the removal of materials from its surface. This allows the material to retain its integrity and hold its form. Abrasion resistance can be measured by rubbing or wiping the transparent protective layer for a specified number of cycles with a rough material such as steel wool or a scouring pad and then inspecting the layer for visible changes such as fine scratches or haze.

An abrasion resistant layer may include a hardcoat layer disposed directly on a display film layer (for example on the substrate or energy dissipation layer) or the hardcoat layer may be disposed on a substrate layer and this composite layer is disposed on a display film layer. The hardcoat layer may have a thickness of less than 50 micrometers, or less than 40 micrometers, or a thickness in a range from 2 to 30 micrometers, or from 2 to 15 micrometers, or from 3 to 10 micrometers. The substrate layer may have a thickness greater than 10 micrometers or less than 200 micrometers. The substrate layer preferably is a transparent polymer layer.

The substrate layer (that forms a portion of the protective layer) may have a thickness in a range from 10 to 125 micrometers, or from 25 to 100 micrometers, or from 30 to 85 micrometers. The substrate layer may have a yield stress value greater than 70 MPa, or greater than 90 MPa, or greater than 120 MPa, or greater than 160 MPa. The phrase "yield stress" or "offset yield stress" refers herein to "0.2% offset yield strength" as defined in ASTM D638-14. ASTM D638-14 section A2.6 defines the test method for "offset yield strength" and is defined as the stress at which the strain exceeds by a specified amount (the offset) an extension of the initial proportional portion of the stress-strain curve. It is expressed in force per unit area, usually megapascals (pounds force per square inch).

The substrate layer may be formed of any useful polymeric material that provides the desired mechanical properties (such as dimensional stability) and optical properties (such as light transmission and clarity) to the display film. Examples of materials suitable for use in the polymeric substrate layer include polymethylmethacrylate, polycarbonate, polyamides, polyimide, polyesters (PET, PEN), polycyclic olefin polymers, and thermoplastic polyurethanes. One useful polymeric material for forming the transparent polymeric substrate layer is polyimide. In many embodiments the polyimide substrate layer is colorless. Colorless polyimide can be formed via chemistry or via nanoparticle incorporation. Some exemplary colorless polyimides formed via chemistry are described in WO 2014/092422.

The substrate layer may be primed or treated to impart some desired property to one or more of its surfaces. In particular the substrate layer can be primed to improve adhesion of the energy dissipation layer or glass layer or an optically clear adhesive layer with the substrate layer. Examples of such treatments include corona, flame, plasma and chemical treatments such as, acrylate or silane treatments.

The hardcoat layer (disposed on the substrate) has a thickness of less than 50 micrometers or less than 40 micrometers. The hardcoat layer has a thickness in a range from 2 to 30 micrometers, or from 2 to 15 micrometers, or from 3 to 10 micrometers. The hardcoat layer includes nanoparticles.

Suitable hardcoats can include a variety of cured polymeric materials having inorganic nanoparticles. These hardcoats can include but are not limited to (meth)acrylic based hardcoats, siloxane hardcoats, polyurethane hardcoats and the like. Suitable hardcoats can include a variety of cured polymeric materials having inorganic nanoparticles. These hardcoats can include but are not limited to (meth)acrylic based hardcoats, siloxane hardcoats, polyurethane hardcoats and the like.

One preferable class of hardcoats include acrylic hardcoats comprising inorganic nanoparticles. Such hardcoats can have a polymerizable resin composition comprising mixtures of multifunctional (meth)acrylic monomers, oligomers, and polymers, where the individual resins can be monofunctional, difunctional, trifunctional, tetrafunctional or have even higher functionality. In preferred cases, the polymerizable (meth)acrylate components of the resin system are chosen such that when polymerized the hardcoat contains little to no free (meth)acrylic monomers.

Useful hardcoat multifunctional (meth)acrylate monomers and oligomers are described above as the materials useful for the cross-linked polyacrylate polymer.

The hardcoat composition may include surface modified inorganic oxide particles that add mechanical strength and durability to the resultant coating. The particles are typically substantially spherical in shape and relatively uniform in size. The particles can have a substantially monodisperse size distribution or a polymodal distribution obtained by blending two or more substantially monodisperse distributions. The inorganic oxide particles are typically non-aggregated (substantially discrete), as aggregation can result in precipitation of the inorganic oxide particles or gelation of the hardcoat. The size of inorganic oxide particles is chosen to avoid significant visible light scattering.

The hardcoat composition may comprise a significant amount of surface modified inorganic oxide nanoparticles having an average (e.g. unassociated) primary particle size or associated particle size of at least 10, 20, 30, 40 or 50 nm and no greater than about 200, 175 or 150 nm. When the hardcoat composition lacks a significant amount of inorganic nanoparticles of such size, the cured hardcoat can crack when subjected to the pencil hardness test. The total concentration of inorganic oxide nanoparticles is typically a least 30, 35, or 40 wt-% solids and generally no greater than 90 wt-%, 80 wt-%, or 75 wt-% and in some embodiments no greater than 70 wt-%, or 65 wt-%, or 60 wt-% solids.

The hardcoat composition may comprise up to about 10 wt-% solids of smaller nanoparticles. Such inorganic oxide nanoparticles typically having an average (e.g. unassociated) primary particle size or associated particle size of at least 1 nm or 5 nm and no greater than 50, 40, or 30 nm.

The average particle size of the inorganic oxide particles can be measured using transmission electron microscopy to count the number of inorganic oxide particles of a given diameter. The inorganic oxide particles can consist essentially of or consist of a single oxide such as silica, or can comprise a combination of oxides, or a core of an oxide of one type (or a core of a material other than a metal oxide) on which is deposited an oxide of another type. Silica is a common inorganic particle utilized in hardcoat compositions. The inorganic oxide particles are often provided in the form of a sol containing a colloidal dispersion of inorganic oxide particles in liquid media. The sol can be prepared using a variety of techniques and in a variety of forms including hydrosols (where water serves as the liquid medium), organosols (where organic liquids so serve), and mixed sols (where the liquid medium contains both water and an organic liquid).

Aqueous colloidal silicas dispersions are commercially available from Nalco Chemical Co., Naperville, Ill. under the trade designation "Nalco Collodial Silicas" such as products 1040, 1042, 1050, 1060, 2327, 2329, and 2329K or Nissan Chemical America Corporation, Houston, Tex. under the trade name Snowtex™. Organic dispersions of colloidal silicas are commercially available from Nissan Chemical under the trade name Organosilicasol™. Suitable fumed silicas include for example, products commercially available from Evonki DeGussa Corp., (Parsippany, N.J.) under the trade designation, "Aerosil series OX-50", as well as product numbers –130, –150, and –200. Fumed silicas are also commercially available from Cabot Corp., Tuscola, Ill., under the trade designations CAB-O-SPERSE 2095", "CAB-O-SPERSE A105", and "CAB-O-SIL M5".

It may be desirable to employ a mixture of inorganic oxide particle types to optimize an optical property, material property, or to lower that total composition cost.

As an alternative to or in combination with silica, the hardcoat may comprise various high refractive index inorganic nanoparticles. Such nanoparticles have a refractive index of at least 1.60, 1.65, 1.70, 1.75, 1.80, 1.85, 1.90, 1.95, 2.00 or higher. High refractive index inorganic nanoparticles include for example zirconia ("$ZrO_2$"), titania ("$TiO_2$"), antimony oxides, alumina, tin oxides, alone or in combination. Mixed metal oxide may also be employed.

Zirconias for use in the high refractive index layer are available from Nalco Chemical Co. under the trade designation "Nalco OOSS008", Buhler AG Uzwil, Switzerland under the trade designation "Buhler zirconia Z-WO sol" and Nissan Chemical America Corporation under the trade name NanoUse ZR™. Zirconia nanoparticles can also be prepared such as described in U.S. Patent Publication No. 2006/0148950 and U.S. Pat. No. 6,376,590. A nanoparticle dispersion that comprises a mixture of tin oxide and zirconia covered by antimony oxide (RI –1.9) is commercially available from Nissan Chemical America Corporation under the trade designation "HX-05M5". A tin oxide nanoparticle dispersion (RI –2.0) is commercially available from Nissan Chemicals Corp. under the trade designation "CX-S401M". Zirconia nanoparticles can also be prepared such as described in U.S. Pat. Nos. 7,241,437 and 6,376,590.

The protective layer may be an elastic nanocomposite layer. The elastic nanocomposite layer may be a nanoparticle nanocomposite ionic elastomeric layer, or an elastic nanocomposite urethane layer. The nanoparticle nanocomposite ionic elastomeric layer, or the elastic nanocomposite urethane layer may be directly coated onto the energy dissipation layer or optically clear adhesive layer. Alternatively, the nanoparticle nanocomposite ionic elastomeric layer, or the elastic nanocomposite urethane layer may be coated onto a transparent substrate layer, as described above, and the transparent substrate layer is directly attached to the energy dissipation layer or optically clear adhesive layer.

The transparent protective layer may be an elastic nanocomposite layer. This layer may have a thickness in a range from 30 to 125 micrometers. This elastic nanocomposite material can be made from any useful material that provides durable surface properties to the outer layer. In some cases, this elastic nanocomposite layer is made from polyurethane nanocomposite materials such as silica nanoparticle filled UV curable polyurethane resins. In other embodiments the elastic nanocomposite material can be made from nanoparticle filled ionic elastomer materials. This elastic nanocomposite layer is capable of stretching within an elastic range, so that permanent deformation does not occur. The proportional limit for a material is defined as the maximum stress at which the stress is proportional to strain (Hooke's law). The elastic limit is the minimum stress at which permanent deformation can be measured. The elastic nanocomposite layer may have a strain at the elastic limit that is 20% greater than the strain at the proportional limit, 50% greater than the strain at the proportional limit, or 100% greater than the strain at the proportional limit. The graph below illustrates this concept.

The overall thickness of the display film described herein may have any useful value depending on the application. The thickness of the display film is a balance between being thick enough to provide the desired display protection and thin enough to provide the folding and reduced thickness design parameters. When the display film folds upon itself, then this film may have a total thickness in a range from 85 to 350 micrometers or from 100 to 300 micrometers or from 150 to 250 micrometers. When the display film moderately flexes, then this film may have total thickness in a range from 300 to 500 micrometers.

Objects and advantages of this disclosure are further illustrated by the following examples, but the particular materials and amounts thereof recited in these examples, as well as other conditions and details, should not be construed to unduly limit this disclosure.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

TABLE 1

| Materials | |
|---|---|
| Abbreviation or Trade Designation | Description |
| K-FLEX 188 "Polyol 1" | Aliphatic polyester polyol, commercially available from King Industries, Norwalk, CT under the trade name "K-FLEX 188" |
| Fomrez 55-112 "Polyol 2" | Hydroxyl terminated saturated linear polyester available from Chemtura, Middlebury, CT under the trade name "Fomrez 55-112" |
| DESMODUR N3300A | Aliphatic polyisocyanate, commercially available from Bayer, Pittsburgh, PA under the trade name "DESMODUR N3300A". |
| DESMODUR N3400 | Aliphatic polyisocyanate, commercially available from Bayer, Pittsburgh, PA under the trade name "DESMODUR N3400". |
| DABCO T-12 | Dibutyltin dilaurate catalyst, commercially available from Air Products and Chemicals, Inc., Allentown, PA, under the trade name "DABCO T-12". |

TABLE 1-continued

Materials

| Abbreviation or Trade Designation | Description |
|---|---|
| CN9004 | Aliphatic polyurethane acrylate oligomer, commercially available from Sartomer Arkema Group, Exton, PA. |
| CN3211 | Aliphatic polyester polyurethane acrylate oligomer, commercially available from Sartomer Arkema Group, Exton, PA. |
| CD9043 | Alkoxylated neopentyl glycol diacrylate, commercially available from Sartomer Arkema Group, Exton, PA. |
| SR501 | Propoxylated trimethylolpropane triacrylate, commercially available from Sartomer Arkema Group, Exton, PA. |
| SR531 | Cyclic trimethylol formal acrylate, commercially available from the Sartomer Arkema Group, Exton, PA. |
| SR415 | Ethoxylated trimethylolpropane triacrylate, commercially available from the Sartomer Arkema Group, Exton, PA. |
| SR399 | Dipentaerythritol pentaacrylate, commercially available from the Sartomer Arkema Group, Exton, PA. |
| SR9035 | ETHOXYLATED (15) TRIMETHYLOLPROPANE TRIACRYLATE, commercially available from the Sartomer Arkema Group, Exton, PA. |
| SR444c | pentaerythritol triacrylate, which contains a pendant hydroxyl group, commercially available from the Sartomer Arkema Group, Exton, PA. |
| SR344 | polyethylene glycol (400) diacrylate, commercially available from the Sartomer Arkema Group, Exton, PA. |
| Esacure 1 | Difunctional alpha hydroxyketone. Acts as photoinitiator, commercially available from Lamberti, in Gallarate, Italy or US subsidiary |
| Irgacure TPO-L | Liquid photoinitiator, BASF |
| Irgacure 184 | Photoinitiator, BASF |
| MEK | Methyl ethyl ketone (aka 2-Butanone), a common solvent available from a variety of suppliers including Sigma-Aldrich, St. Louis, MO |
| Scotchgard PM-1501 | Wood Protector available from 3M |

Preparation of Hardcoated Solution 1

A hardcoat solution was made by mixing 1.51 grams of Esacure 1 (Lamberti, Gallarate, Italy), 109.18 grams of 3-methacryloxypropyltrimethoxysilane functionalized 20 nm silica particles (45% by weight in 1-methoxy-2-propanol), 36.39 grams of methyltrimethoxysilane functionalized 20 nm silica particles (45% by weight in 1-methoxy-2-propanol), 10.37 grams of SR399, 13.96 grams of SR9035, 19.14 grams of SR444c, 1.72 grams of SR344 in 57.49 grams of methyl ethyl ketone (Fisher scientific). The solution was stirred until all components were dissolved. To the solution was added 0.24 g of Scotchgard PM-1501 (3M) and the solution was stirred for another 20 minutes. The resulting solution was essentially homogeneous with a clear bluish appearance.

Polyurethane Examples 1-5

Samples of shape memory polyurethane were prepared in a roll to roll process where the isocyanate and polyol with catalyst were mixed using an inline dynamic mixer. The solutions were applied to a moving web between two silicone release liners at an appropriate flow rate to achieve the desired final sample thickness. The polyurethane between films were heated at 70° C. and wound into a roll. The films were postbaked at 70° C. for 24 hours prior to lamination to glass. Samples had a range of equivalents of NCO reacted with 1.0 equivalents of —OH, as shown in Table 2 in order to achieve the desired glass transition temperature and crosslink concentration. Relative proportions by mass of K-FLEX 188 and Desmodur N3300 for samples 1-5 are shown in Table 2. The coated materials contained about 350 ppm dibutyltin dilaurate catalyst.

TABLE 2

Coating compositions and theoretical crosslink concentration

| Example | Polyol with catalyst (g) | DESMODUR 3300 (g) | NCO/OH Ratio | Theoretical Gel Content | Theoretical Crosslink Concentration (mol/kg) |
|---|---|---|---|---|---|
| 1 | 32.8 | 20.74 | 0.8 | 96.67% | 0.34 |
| 2 | 32.8 | 22.03 | 0.85 | 98.31% | 0.42 |
| 3 | 32.8 | 23.33 | 0.9 | 99.32% | 0.49 |
| 4 | 32.8 | 24.62 | 0.95 | 99.85% | 0.57 |
| 5 | 32.8 | 25.92 | 1 | 100% | 0.65 |

Polyurethane Examples 6-9

Similar to samples 1-5, but these polyurethane coatings were made with a mixture of isocyanates. The polyurethanes, for these examples, was composed of an aliphatic polyol (K-FLEX 188) reacted with a blend of multifunctional isocyanates (Desmodur N3300 and Desmodur N3400), prepared in the same manner as samples 1-5. The weight ratio K-FLEX to Desmodur N3300 to Desmodur N3400 for samples 6-9 are shown in Table 3.

TABLE 3

Mix ratios for polyurethanes for Examples 6-9

| Example | K188 | N3300 | N3400 | NCO/OH Ratio | (NCO + UD)/OH Ratio[1] | Theoretical Gel Content | Theoretical Crosslink Concentration |
|---|---|---|---|---|---|---|---|
| 6 | 62.8 | 0 | 37.2 | 0.75 | 1.03 | 100% | 0.74 |
| 7 | 62.4 | 18.8 | 18.8 | 0.76 | 0.91 | 99.3% | 0.55 |
| 8 | 65.2 | 17.4 | 17.4 | 0.67 | 0.80 | 96.5% | 0.37 |
| 9 | 62.5 | 25.0 | 12.5 | 0.76 | 0.85 | 98.3% | 0.45 |

[1]Note that the N3400 isocyanate contains a uretdione unit that can react with excess OH in the polyol component at elevated temperature to form an allophanate group. For this reason, the table contains two stoichiometric ratio columns. The first calculates the NCO/OH ratio based on only existing NCO content in N3300 and N3400 at the beginning of the reaction. The NCO + UD/OH ratio accounts for the ratio after the uretdione is reacted with excess OH of the polyol.

Polyurethane Example 10

Similar to samples 1-5, but this polyurethane coating was made with an alternative polyol, Fomrez 55-112 in order to achieve an even lower glass transition temperature. The polyurethane was composed of an aliphatic polyol (Fomrez 55-112) reacted with a multifunctional isocyanate (Desmodur N3300), prepared in the same manner as samples 1-5. The weight ratio Fomrez 55-112 to Desmodur N3300 for sample 10 is shown in Table 4. Ovens were run at 70° C. and the samples were post-cured for 24 hours at 70° C.

TABLE 4

Coating composition and theoretical crosslink concetration

| Example | Fomrez 55-112 with catalyst (g) | DESMODUR 3300 (g) | NCO/OH Ratio | Theoretical Gel Content | Theoretical Crosslink Concentration (mol/kg) |
|---|---|---|---|---|---|
| 10 | 72.0 | 28.05 | 1.00 | 100.0% | 0.41 |

Polyurethane Layer Characterization

Glass Transition Temperature

The glass transition temperature of the polyurethane coatings was characterized using Q800 DMA from TA Instruments. Samples were cut into strips 6.35 mm wide and about 4 cm long. The thickness of each film was measured. The films were mounted in the tensile grips of a Q800 DMA from TA Instruments with an initial grip separation between 16 mm and 19 mm. The samples were then tested at an oscillation of 0.2% strain and 1 Hz throughout a temperature ramp from −50° C. to 200° C. at a rate of 2° C. per minute. The results are shown in Table 5. The onset of the glass transition was determined by location of peak for E". The temperature at which the Tan Delta signal reached a maximum was recorded as the peak Tan Delta temperature.

TABLE 5

Thermal and mechanical properties of the coatings alone

Dynamic Mechanical Analysis

| Example | Tg by E" (° C.) | Storage Modulus @ 0° C. (GPa) | Peak Tan Delta | Temp at peak Tan Delta (° C.) |
|---|---|---|---|---|
| 1 | 25.2 | 1.47 | 1.79 | 39.4 |
| 2 | 30.9 | 1.47 | 1.66 | 43.9 |
| 3 | 37.5 | 1.4 | 1.68 | 47.5 |
| 4 | 40.8 | 1.43 | 1.61 | 49.8 |
| 5 | 38.6 | 1.54 | 1.46 | 47.5 |
| 6 | 9.32 | 1.36 | 1.76 | 16.1 |
| 7 | 13.5 | 1.62 | 1.76 | 25.6 |
| 8 | 8.7 | 1.54 | 1.87 | 20.5 |
| 9 | 6.2 | 1.75 | 1.48 | 18.5 |
| 10 | −25 | 0.003 | 1.32 | −11 |

Example 11: Polyurethane Acrylate Resin and Film

Into a Flacktek Inc. size 20 speedmixer cup was added 99.5 g of CN9004 and 0.5 g of Irgacure TPO-L catalyst. The contents were mixed using a Flacktek DAC 150 FVZ-K speedmixer and were mixed at 3100 rpm for 1 min. The resulting solution was homogeneous near colorless viscous solution. The resulting solution was then placed into a vacuum oven at 40 Celsius and was degassed to remove all dissolved air and bubbles from the viscous solution. The solution had a viscosity of ~50000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 12: Polyurethane Acrylate Resin and Film

Into a Flacktek Inc. size 20 speedmixer cup was added 99.5 g of CN3211 and 0.5 g of Irgacure TPO-L catalyst. The contents were mixed using a Flacktek DAC 150 FVZ-K speedmixer and were mixed at 3100 rpm for 1 min. The resulting solution was homogeneous near colorless viscous solution. The resulting solution was then placed into a vacuum oven at 40 Celsius and was degassed to remove all dissolved air and bubbles from the viscous solution. The solution had a viscosity of ~25000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 13: Polyurethane Acrylate Resin (90/10) and Film

Into a Flacktek Inc. size 20 speedmixer cup was added 79.60 g of CN3211 (Sartomer, Inc.) and 19.90 g of SR501 (Sartomer, Inc.). The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~8500 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 14: Polyurethane Acrylate Resin (80/20) and Film

Into a Flacktek Inc. size 20 speedmixer cup was added 79.60 g of CN3211 and 19.90 g of CD9043. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~5800 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 15: Polyurethane Acrylate Resin (80/20) and Film

Into a Flacktek Inc. size 20 speedmixer cup was added 79.60 g of CN3211 and 19.90 g of SR415. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~5500 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 16: Polyurethane Acrylate Resin (70/30) and Film

Into a Flacktek Inc. size 20 speedmixer cup was added 69.65 g of CN3211 and 29.85 g of SR531. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~4000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 17: Polyurethane Acrylate Resin (80/20) and Film

Into a Flacktek Inc. size 20 speedmixer cup was added 79.60 g of CN3211 and 19.90 g of SR531. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~5000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 18: Polyurethane Acrylate Resin (90/10) and Film

Into a Flacktek Inc. size 20 speedmixer cup was added 89.55 g of CN3211 (Sartomer, Inc.) and 9.95 g of SR531 (Sartomer, Inc.). The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~6000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

300 mm wide, 30 m length, 100 micron thickness). A film sample of shape memory polyurethane was prepared by coating between two silicone release liners. The polyurethane film was made by mixing a polyol containing ~500 ppm of a tin catalyst and an isocyanate. The Polyol with catalyst (K-FLEX 188) and isocyanate (DESMODUR N3300) were added to separate pumps carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rate for the Polyol with catalyst and DESMODUR N3300 were to 32.8 g/min and 20.74 g/min respectively to give an overall target NCO/OH ratio for the polyurethane reactive mixture of 0.8. The 2-part polyurethane reactive mixture was coated between two silicone release liners (for example for example T50 release liner available from Eastman Chemical). The reactive mixture was coated to a desired thickness between the release films in a continuous fashion using a notch bar coating method where thickness was controlled by setting a defined gap. The coated polyurethane film was heated at elevated temperature on hot platens to gel the polyurethane film and resulting film was placed into a 70° C. oven for 16 hours to cure. The resulting film with liners was ~260 um. The polyurethane film was ~156 um. The glass/polyurethane construction was made by peeling the liner from one side of the polyurethane film and laminating it to the glass. This laminated structure was heated at 70° C. for approximately 24 hours. The second liner was removed and the glass/polyurethane construction was subjected to ball drop and impact testing and results are described in Table 7.

Example B

A 3 inch by 6 inch sample of glass was cut using a diamond scribe from a roll of NEG glass (material OA-10G,

TABLE 6

Properties of crosslinked polyurethane core layer materials

| Example | Oligomer/Diluent | Oligomer to Diluent Ratio | Tg (° C.) (Peak Tan δ) | Tan δ | Tg by E" (° C.) (from DMA Storage Modulus) | Storage Modulus (MPa) (23° C./−20° C.) |
|---|---|---|---|---|---|---|
| 11 | CN9004/NA | 100/0 | −67 | 0.614 | −73.6 | 7.42/9.86 |
| 12 | CN3211/NA | 100/0 | −20.7 | 1.473 | −29.7 | 2.87/27.4 |
| 13 | CN3211/SR501 | 80/20 | −5.24 | 0.639 | −25.1 | 7.74/515.9 |
| 14 | CN3211/CD9043 | 80/20 | −24.1 | 1.390 | −32.3 | 3.59/15.99 |
| 15 | CN3211/SR415 | 80/20 | −21.5 | 1.334 | −28.8 | 5.09/31.22 |
| 16 | CN3211/SR531 | 70/30 | −5.5 | 1.334 | −22.9 | 1.80/711.9 |
| 17 | CN3211/SR531 | 80/20 | −11.0 | 1.359 | −24.9 | 2.23/360.1 |
| 18 | CN3211/SR531 | 90/10 | −16.7 | 1.398 | −27.3 | 2.39/97.4 |

Dynamic Mechanical Analysis Test Method

Samples were cut into strips 6.35 mm wide and about 4 cm long. The thickness of each film was measured. The films were mounted in the tensile grips of a Q800 DMA from TA Instruments with an initial grip separation between 16 mm and 19 mm. The samples were then tested at an oscillation of 0.2% strain and 1 Hz throughout a temperature ramp from −20° C. to 200° C. at a rate of 2° C. per minute. The temperature at which the Tan Delta signal reached a maximum was recorded as the peak Tan Delta temperature. Glass transition temperatures were taken from peak of E".

Glass/Polyurethane Constructions

Example A

A 3 inch by 6 inch sample of glass was cut using a diamond scribe from a roll of NEG glass (material OA-10G, 300 mm wide, 30 m length, 100 micron thickness). A film sample of shape memory polyurethane was prepared by coating between two silicone release liners. The polyurethane film was made by mixing a polyol containing ~500 ppm of a tin catalyst and an isocyanate. The Polyol with catalyst (K-FLEX 188) and isocyanate mixture (DESMODUR N3300 and Desmodur 3400) were added to separate pumps carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rates for the Polyol with catalyst and DESMODUR N3300 and Desmodur 3400 were set to 65.2 g/min, 17.4 g/min and 17.4 g/min respectively to give an overall target NCO/OH ratio for the polyurethane reactive mixture of 0.67. The 2-part polyurethane reactive mixture was coated between two silicone release liners (for example T50 release liner available from Eastman Chemical). The reactive mixture was coated to a desired thickness between the release films in a continuous fashion using a notch bar coating method where thickness was controlled by setting a defined gap. The coated polyurethane film was heated at elevated temperature (~160° F.) on hot platens to gel the polyurethane film and resulting film was placed into a 70° C. oven for 16 hours to cure. The resulting film with liners was ~240 um. The polyurethane film was ~136 um.

The glass/polyurethane construction was made by peeling the liner from one side of the polyurethane film and laminating it to the glass. This laminated structure was heated at 70° C. for approximately 24 hours. The second liner was removed and the glass/polyurethane construction was subjected to ball drop and impact testing and results are described in Table 7.

Example C

A 3 inch by 6 inch sample of glass was cut via diamond scribe from a roll of 100 micron thick Schott glass (Type D263™ T eco). Into a Flacktek Inc. size 20 speedmixer cup was added 14 g of K-FLEX 188 containing ~500 ppm of DABCO T-12 and ~10.0 g of Desmodur N-3300A. The contents were mixed using a Flacktek DAC 150 FVZ-K speedmixer and were mixed at 1500 rpm for 30 seconds. The resulting viscous mixture was homogeneous and near colorless. The viscous mixture was applied to the surface of the glass by placing the glass sample between two silicone release liners and coating the polyurethane over the glass sample by pulling two release liners with polyurethane under a notch bar having a defined gap to produce a 100 um thick coating of polyurethane on 100 um thick glass. The sample between liners was cured at 70° C. for 24 hours. The two release liners were removed to give the glass and polyurethane construction. The construction was subjected to ball drop and impact testing and results are described in Table 7.

Example D

A was polyurethane glass construction was prepared as described above in Example C and a 2 mil layer of PET (available from DuPont) was laminated to the polyurethane using a 2 mil optically clear film adhesive (8146 OCA available from 3M). The construction was subjected to ball drop and impact testing and results are described in Table 7.

Comparative Example 1

A 4 mil layer of an optically clear adhesive (3M 8146 OCA) was laminated to a 100 micron thick NEG glass layer as described in Example A. A 2 mil PET film (Available from DuPont) was laminated to the other side of the adhesive. The glass/OCA construction with 2 mils of OCA between the glass and PET layers was subjected to ball drop and impact testing and results are described in Table 7.

Comparative Example 2

To a 100 um sample of Schott glass as described in example C was laminated in succession three layers of 2 mil of 3M 8146 OCA followed by a layer of 2 mil of PET (available from DuPont). The resulting glass/OCA construction with 6 mils of OCA between the glass and PET layers was subjected to ball drop and impact testing and results are described in Table 7.

TABLE 7

| Impact test results | | |
| --- | --- | --- |
| Example | 4.3 g Ball Drop (cm) | Pen Drop (cm) |
| A | 27 | >16 |
| B | 27 | >16 |
| C | 27 | >16 |
| D | 27 | 16 |
| C1 | 4 | 10 |
| C2 | 7 | 6 |

The impact resistance of the protective display film was tested two ways: first by dropping a 4.3 g stainless steel ball on to each construction and then by dropping a Bic™ stick pen (1 mm ball tip) with cap attached to the non-writing end (total weight 5.5 g), from the specified height. The drop height was measured from the bottom of the ball or writing tip of the pen to the surface of the sample. The ball and pen were both dropped down a narrow tube that ensured that the pen hit the sample at approximately 90 degree angle with respect to the surface. A new area of the sample free of pre-existing cracks was used for each drop test. The maximum drop height that could be tested with the apparatus was 27 cm for the ball and 16 cm for the pen. The critical height was recorded as the maximum height the ball or pen could be dropped from without a permanent mark or the glass cracking.

Segmented Glass Constructions

Example E

A 3 inch by 6 inch sample of glass was cut using a diamond scribe from a roll of NEG glass (Nippon Electric Glass Company, material OA-10G, 300 mm wide, 30 m length, 100 micron thickness). A film sample of shape memory polyurethane was prepared by coating between two silicone release liners. The polyurethane film was made by mixing a polyol containing ~500 ppm of a tin catalyst and an isocyanate. The Polyol with catalyst (K-FLEX 188) and isocyanate (DESMODUR N3300) were added to separate pumps carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rate for the Polyol with catalyst and DESMODUR N3300 were to 32.8 g/min and 20.74 g/min respectively to give an overall target NCO/OH ratio for the polyurethane reactive mixture of 0.8. The 2-part polyurethane reactive mixture was coated between two silicone release liners (for example for example T50 release liner available from Eastman Chemical). The reactive mixture was coated to a desired thickness between the release films in a continuous fashion using a notch bar coating method where thickness was controlled by setting a defined gap. The coated polyurethane film was heated at elevated temperature on hot platens to gel the polyurethane film and resulting film was placed into a 70° C. oven for 16 hours to cure. The resulting film with liners was ~260 um. The polyurethane film was ~156 um.

The glass/polyurethane construction was made by peeling the liner from one side of the polyurethane film and laminating it to the glass. This laminated structure was heated at 70° C. for approximately 24 hours with a glass plate on top giving even pressure. Segmentation was then created by forcing the sample to conform around a 3 mm diameter metal rod. The resulting structure was composed of nearly parallel cracks which translated the full width of the 3 inch glass sample to create a bending region in the sample.

Visibility of the cracks was reduced by applying an acrylic coating to the glass surface. The coating solution (Hardcoat solution 1, described above) was applied via syringe to the sample. (Note that bending or stretching the sample may aide in complete wet out of the cracks). A piece of PET film was used as a knife coater and translated across the sample surface to create an approximately even and thin coating on the sample. The sample was allowed to dry in air at room temperature for 30 minutes and then UV cured in a fusion system with an H-bulb at 100% power and belt speed at 10 ft/min (Fusion UV System, Inc., Gathersburg, Md. Model#I6P1/LH). After removing the remaining liner, the resulting sample appeared clear with the ability to be bent with the final acrylic coating on the concave (compressed) side, i.e folding toward the coated side of the glass. The sample was folded in compression to an approximate radius of 5 mm.

Example F

A 3 inch by 6 inch sample of glass was cut using a diamond scribe from a roll of NEG glass (Nippon Electric Glass Company, material OA-10G, 300 mm wide, 30 m length, 100 micron thickness). A film sample of shape memory polyurethane was prepared by coating between two silicone release liners. The polyurethane film was made by mixing a polyol containing ~500 ppm of a tin catalyst and an isocyanate. The Polyol with catalyst (K-FLEX 188) and isocyanate (DESMODUR N3300) were added to separate pumps carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rate for the Polyol with catalyst and DESMODUR N3300 were to 32.8 g/min and 20.74 g/min respectively to give an overall target NCO/OH ratio for the polyurethane reactive mixture of 0.8. The 2-part polyurethane reactive mixture was coated between two silicone release liners (for example for example T50 release liner available from Eastman Chemical). The reactive mixture was coated to a desired thickness between the release films in a continuous fashion using a notch bar coating method where thickness was controlled by setting a defined gap. The coated polyurethane film was heated at elevated temperature on hot platens to gel the polyurethane film and resulting film was placed into a 70° C. oven for 16 hours to cure. The resulting film with liners was ~260 um. The polyurethane film was ~156 um.

The glass/polyurethane construction was made by peeling the liner from one side of the polyurethane film and laminating it to the glass. This laminated structure was heated at 70° C. for approximately 24 hours with a glass plate on top giving even pressure. Segmentation may then be created by using a rubber stamp to apply a clear acrylic ink in a pattern of arrayed squares, curing the ink, and etching the sample with a solution of HF. The resulting sample may have an array of square glass platelets on the urethane film. After rinsing and drying, the sample may be coated with the clear acrylic ink to planarize and restore clarity to the sample.

Example G

A 3 inch by 6 inch sample of glass may be cut via laser from a sheet of 100 micron thick Schott glass (Type D263™ T eco). Additionally, this piece of glass may have additional laser cuts creating an array of glass segments 0.3 mm wide by 3 inches long in the center of the sample extending the width of the sample and spaced with 100 micron gaps. A silicone liner film with weak adhesion may be affixed to the exposed side of the glass sample to be able to move the segmented glass construction while maintaining positioning of the segments.

Into a Flacktek Inc. size 20 speedmixer cup was added 14 g of K-FLEX 188 containing ~500 ppm of DABCO T-12 and ~10.0 g of Desmodur N-3300A. The contents were mixed using a Flacktek DAC 150 FVZ-K speedmixer and were mixed at 1500 rpm for 30 seconds. The resulting viscous mixture was homogeneous and near colorless. The viscous mixture may be applied to the patterned glass sample by pulling two silicone release liners (one having the glass sample adhered) with the polyurethane mixture under a notch bar having a defined gap to produce a 100 um thick coating of polyurethane on the 100 um thick patterned glass. Note that coating in the same direction as the gaps in the glass may allow for complete coating without air entrainment. The sample between liners may be cured at 70° C. for 24 hours. The two release liners can be removed to give the embedded patterned glass and polyurethane construction. The resulting transparent sample may be bent to a radius of 5 mm or less in the segmented region.

Thus, embodiments of SEGMENTED PROTECTIVE DISPLAY FILM are disclosed. All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A display film comprising:
   a transparent glass layer comprising two or more coplanar glass layer segments and having a thickness defined by a first major surface and a second major surface opposing the first major surface, the thickness being less than 500 micrometers, or in a range from 25 micrometers to 250 micrometers, or in a range from 25 micrometers to 150 micrometers;
   interstitial polymer material separating adjacent segments, and
   a transparent energy dissipation layer disposed on the first major surface, the transparent energy dissipation layer having a glass transition temperature of 27 degrees Celsius or less and a Tan Delta peak value of 0.5 or greater.

2. The display film according to claim 1, wherein the transparent energy dissipation layer comprises cross-linked polyurethane or cross-linked polyurethane acrylate or cross-linked polyurethane and polyacrylate.

3. The display film according to claim 1, wherein the interstitial polymer material has a first refractive index value and the glass segments have a second refractive index value and the refractive index value is within 0.1, or within 0.05, or within 0.02, or within 0.01 of the second refractive index value.

4. The display film according to claim 1, wherein the glass layer segments are configured to provide bending or folding of the glass layer without fracturing the glass layer segments.

5. The display film according to claim 1, wherein the glass layer segments are parallel segments that extend along one entire dimension (length or width) of the display film.

6. The display film according to claim 1, wherein the glass layer segments are non-uniform segments that define a bending region of the display film.

7. The display film according to claim 1, wherein the glass layer segments have an aspect ratio (width to thickness) in a range from 1:1 to 100:1.

8. The display film according to claim 1, wherein the display film has a haze value of less than 5%, or less than 3%, or less than 2%, or less than 1%, and the display film has a visible light transmission value greater than 85%, or greater than 90%, and the display film has a clarity value greater than 90%, or greater than 95% or greater than 98%.

9. The display film according to claim 1, wherein the transparent energy dissipation layer has a glass transition temperature of 15 degrees Celsius or less, 10 degrees Celsius or less, 5 degrees Celsius or less, or 0 degrees Celsius or less, or −5 degrees Celsius or less, or in a range from −40 to 15 degrees Celsius, or in a range from −30 to 15 degrees Celsius, or in a range from −30 to 10 degrees Celsius, or in a range from −30 to 5 degrees Celsius, or in a range from −30 to 0 degrees Celsius, or in a range from −20 to 0 degrees Celsius.

10. The display film according to claim 1, wherein the transparent energy dissipation layer has a Tan Delta peak value of 0.8 or greater, or 1.0 or greater, or 1.2 or greater, or in a range from 0.5 to 2.5, or in a range from 1 to 2.5.

11. The display film according to claim 1, further comprising a protective layer disposed on the second major surface.

12. The display film according to claim 11, wherein the protective layer is formed of the same material as the interstitial polymer material.

13. The display film according to claim 11, wherein the protective layer comprises nanoparticles and has a thickness in a range from 2 to 30 micrometers, or from 2 to 15 micrometers, or from 3 to 10 micrometers.

14. The display film according to claim 1, further comprising an adhesive layer disposed on the transparent energy dissipation layer, and the transparent energy dissipation layer separates the transparent glass layer from the adhesive layer.

15. The display film according to claim 1, further comprising a transparent polymeric substrate layer disposed on the transparent energy dissipation layer, and the transparent energy dissipation layer separates the transparent glass layer from the transparent polymeric substrate layer, wherein the transparent polymeric substrate layer has a thickness in a range from 10 to 125 micrometers, or from 25 to 100 micrometers, or from 30 to 85 micrometers, and a yield stress value greater than 90 MPa, or greater than 100 MPa, or greater than 120 MPa, or greater than 160 MPa.

16. The display film according to claim 1, wherein the interstitial polymer material is formed of the same material as the transparent energy dissipation layer.

17. The display film according to claim 1, wherein the display film has a thickness of less than 500 micrometers, or less than 300 micrometers, or less than 200 micrometers, or in a range from 85 to 350 micrometers or from 100 to 250 micrometers or from 100 to 200 micrometers.

18. A display film comprising:
a transparent glass layer comprising two or more co-planar glass layer segments and having a thickness defined by a first major surface and a second major surface opposing the first major surface, the thickness being less than 500 micrometers, or in a range from 25 micrometers to 250 micrometers, or in a range from 25 micrometers to 150 micrometers;
a polymer layer disposed on the first major surface, the polymer layer formed of a polymer material and the polymer material also forming interstitial polymer material separating adjacent segments, and
a transparent energy dissipation layer disposed on the polymer layer, the polymer layer separating the transparent energy dissipation layer from the transparent glass layer, the transparent energy dissipation layer having a glass transition temperature of 27 degrees Celsius or less and a Tan Delta peak value of 0.5 or greater.

19. The display film according to claim 18, wherein the transparent energy dissipation layer comprises cross-linked polyurethane or cross-linked polyurethane acrylate or cross-linked polyurethane and polyacrylate.

20. The display film according to claim 18, wherein the polymer layer and interstitial polymer material have a first refractive index value and the glass segments have a second refractive index value and the refractive index value is within 0.1, or within 0.05, or within 0.02, or within 0.01 of the second refractive index value.

21. The display film according to claim 18, wherein the glass layer segments are configured to provide bending or folding of the glass layer without fracturing the glass layer segments.

22. The display film according to claim 18, wherein the glass layer segments are parallel segments that extend along one entire dimension (length or width) of the display film.

23. The display film according to claim 18, wherein the glass layer segments are non-uniform segments that define a bending region of the display film.

24. The display film according to claim 18, wherein the glass layer segments have an aspect ratio (width to thickness) in a range from 1:1 to 100:1.

25. The display film according to claim 18, wherein the display film has a haze value of less than 5%, or less than 3%, or less than 1%, or less than 1%, and the display film has a visible light transmission value greater than 85%, or greater than 90%, and the display film has a clarity value greater than 90%, or greater than 95% or greater than 98%.

26. The display film according to claim 18, wherein the transparent energy dissipation layer has a glass transition temperature of 15 degrees Celsius or less, 10 degrees Celsius or less, 5 degrees Celsius or less, or 0 degrees Celsius or less, or −5 degrees Celsius or less, or in a range from −40 to 15 degrees Celsius, or in a range from −30 to 15 degrees Celsius, or in a range from −30 to 10 degrees Celsius, or in a range from −30 to 5 degrees Celsius, or in a range from −30 to 0 degrees Celsius, or in a range from −20 to 0 degrees Celsius.

27. The display film according to claim 18, wherein the transparent energy dissipation layer has a Tan Delta peak value of 0.8 or greater, or 1.0 or greater, or 1.2 or greater, or in a range from 0.5 to 2.5, or in a range from 1 to 2.5.

28. The display film according to claim 18, further comprising a protective layer disposed on the second major surface.

29. The display film according to claim 28, wherein the protective layer is formed of the same material as the polymer layer.

30. The display film according to claim 28, wherein the protective layer comprises nanoparticles and has a thickness in a range from 2 to 30 micrometers, or from 2 to 15 micrometers, or from 3 to 10 micrometers.

31. The display film according to claim 18, further comprising an adhesive layer disposed on the transparent energy dissipation layer, and the transparent energy dissipation layer separates the polymer layer from the adhesive layer.

32. The display film according to claim 18, further comprising a transparent polymeric substrate layer disposed on the transparent energy dissipation layer, and the transparent energy dissipation layer separates the polymer layer from the transparent polymeric substrate layer, wherein the transparent polymeric substrate layer has a thickness in a range from 10 to 125 micrometers, or from 25 to 100 micrometers, or from 30 to 85 micrometers, and a yield stress value greater than 90 MPa, or greater than 100 MPa, or greater than 120 MPa, or greater than 160 MPa.

33. The display film according to claim 18, wherein the display film has a thickness of less than 500 micrometers, or less than 300 micrometers, or less than 200 micrometers, or in a range from 85 to 350 micrometers or from 100 to 250 micrometers or from 100 to 200 micrometers.

34. An article, comprising:
an optical display;
a display film according to claim 1; and
an optical adhesive layer fixing the display film to the optical display.

35. The article according to claim 34, wherein the optical display comprise organic light emitting diodes.

36. The article according to claim 35, wherein the optical display and display film is foldable so that the optical display faces itself and at least a portion of the display film overlaps with another portion of the display film.

* * * * *